United States Patent
Oldziej et al.

(10) Patent No.: US 12,131,884 B2
(45) Date of Patent: Oct. 29, 2024

(54) PULSE AND BIAS SYNCHRONIZATION METHODS AND SYSTEMS

(71) Applicant: MKS Instruments, Inc., Andover, MA (US)

(72) Inventors: Mariusz Oldziej, Avon, NY (US); Aaron Radomski, Conesus, NY (US); Aaron Burry, Ontario, NY (US); Michael Kirk, Bloomfield, NY (US)

(73) Assignee: MKS Instruments, Inc., Andover, MA (US)

( * ) Notice: Subject to any disclaimer, the term of this patent is extended or adjusted under 35 U.S.C. 154(b) by 8 days.

(21) Appl. No.: 18/084,696

(22) Filed: Dec. 20, 2022

(65) Prior Publication Data

US 2023/0223235 A1 Jul. 13, 2023

Related U.S. Application Data

(60) Provisional application No. 63/298,825, filed on Jan. 12, 2022.

(51) Int. Cl.
*H03H 11/28* (2006.01)
*H01J 37/32* (2006.01)

(52) U.S. Cl.
CPC ....... *H01J 37/32146* (2013.01); *H03H 11/28* (2013.01); *H01J 2237/24507* (2013.01); *H01J 2237/334* (2013.01)

(58) Field of Classification Search
None
See application file for complete search history.

(56) References Cited

U.S. PATENT DOCUMENTS

| 7,602,127 | B2 | 10/2009 | Coumou |
| 8,110,991 | B2 | 2/2012 | Coumou |

(Continued)

FOREIGN PATENT DOCUMENTS

| JP | 2021503700 A | 2/2021 |
| TW | 201206254 A | 2/2012 |

(Continued)

OTHER PUBLICATIONS

International Search Report and Written Opinion regarding Application No. PCT/US2022/053827, mailed May 17, 2023.

(Continued)

*Primary Examiner* — Jeffrey S Zweizig
(74) *Attorney, Agent, or Firm* — Harness, Dickey & Pierce, P.L.C.

(57) ABSTRACT

A radio frequency (RF) generator includes a RF power source configured to output an RF power signal, and a controller coupled to the RF power source. The controller is configured to generate a pulse to modulate the RF power signal of the RF power source. The pulse includes one or more state transitions. The controller is further configured to receive a sync signal indicative of one or more operating characteristics or parameters of another RF generator, and adjust at least one of the state transitions of the pulse to synchronize the state transition with a defined phase of the received sync signal. Other example RF generators, RF power delivery systems including one or more RF generators, and control methods for adjusting a state transition of a pulse to synchronize the state transition with a defined phase of a sync signal are also disclosed.

31 Claims, 17 Drawing Sheets

(56) References Cited

U.S. PATENT DOCUMENTS

| | | |
|---|---|---|
| 8,395,322 B2 | 3/2013 | Coumou |
| 9,947,514 B2 | 4/2018 | Radomski et al. |
| 10,049,857 B2 | 8/2018 | Fisk, II et al. |
| 10,546,724 B2 * | 1/2020 | Radomski ......... H01J 37/32091 |
| 10,821,542 B2 | 11/2020 | Nelson et al. |
| 11,232,931 B2 | 1/2022 | Huh et al. |
| 11,315,757 B2 * | 4/2022 | Martinez ........... H01J 37/32146 |
| 11,527,384 B2 * | 12/2022 | Burry ................ H01J 37/32935 |
| 11,536,755 B2 * | 12/2022 | Fisk, II .................. G01R 23/16 |
| 2015/0170880 A1 | 6/2015 | Muto et al. |
| 2017/0358428 A1 | 12/2017 | Kawasaki et al. |
| 2020/0144025 A1 | 5/2020 | Radomski et al. |

FOREIGN PATENT DOCUMENTS

| | | | |
|---|---|---|---|
| TW | 202130228 A | 8/2021 | |
| TW | 1750639 B | 12/2021 | |
| WO | WO-2020223129 A1 | 11/2020 | |

OTHER PUBLICATIONS

Taiwanese Office Action regarding Patent Application No. 112100034, dated May 31, 2024.

* cited by examiner

PULSE AND BIAS SYNCHRONIZATION METHODS AND SYSTEMS

CROSS-REFERENCE TO RELATED APPLICATIONS

This application claims the benefit of U.S. Provisional Application No. 63/298,825, filed on Jan. 12, 2022. The entire disclosure of the above application is incorporated herein by reference.

FIELD

The present disclosure relates to pulse and bias synchronization systems and methods.

BACKGROUND

Plasma processing is frequently used in semiconductor fabrication. In plasma processing, ions are accelerated by an electric field to etch material from or deposit material onto a surface of a substrate. In one basic implementation, the electric field is generated based on Radio Frequency (RF) or Direct Current (DC) power signals generated by one or more RF or DC generators of a power delivery system.

The power delivery system typically includes at least two generators, such as a source generator and a bias generator. The bias generator may control plasma parameters such as ion energy. In some implementations, the bias generator may operate at a frequency lower than the source generator. For example, the bias generator may operate at 400 kHz, and the source generator may operate at 60 MHz.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

According to one aspect of the present disclosure, a radio frequency (RF) generator includes a RF power source configured to output an RF power signal, and a controller coupled to the RF power source. The controller is configured to generate a pulse to modulate the RF power signal of the RF power source. The pulse includes one or more state transitions. The controller is further configured to receive a sync signal indicative of one or more operating characteristics or parameters of another RF generator, and adjust at least one of the state transitions of the pulse to synchronize the state transition with a defined phase of the received sync signal.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a radio frequency (RF) generator. The RF generator also includes a RF power source configured to output an RF power signal. The RF generator also includes a controller coupled to the RF power source, the controller configured to: generate a pulse to modulate the RF power signal of the RF power source, the pulse including one or more state transitions; receive a sync signal indicative of one or more operating characteristics or parameters of an other RF generator; and adjust at least one of the state transitions of the pulse to synchronize the state transition with a defined phase of the received sync signal. Other embodiments of this aspect include corresponding computer systems, apparatus, and computer programs recorded on one or more computer storage devices, each configured to perform the actions of the methods.

Implementations may include one or more of the following features. The RF generator where the sync signal is a square waveform generated by the other RF generator. The sync signal changes states at zero crossings of an RF power signal from the other RF generator. The controller includes a sync monitor module configured to receive the sync signal and generate a sync active signal based on the defined phase of the sync signal. The defined phase includes 0 degrees, 90 degrees, 120 degrees, or 180 degrees. The controller includes a pulse state latch module in communication with the sync monitor module, and where the pulse state latch module is configured to receive a pulse state signal indicative of a desired state transition of the pulse, and in response to receiving the sync active signal, output a synced pulse state signal based on the pulse state signal to adjust the at least one of the state transitions of the pulse. The controller includes a pulse state generator module in communication with the pulse state latch module, and where the pulse state generator module is configured to generate the pulse state signal. The controller includes an RF power control module in communication with the pulse state latch module, and where the RF power control module is configured to receive the synced pulse state signal, and generate a control signal for controlling the pulse. The RF generator is a first RF generator, and where the pulse state latch module is configured to output the synced pulse state signal to a second RF generator to activate a pulse shaping mode in the second RF generator. The RF power source is configured to output the RF power signal to a matching network, and where the pulse state latch module is configured to output the synced pulse state signal to the matching network to align tuning of the matching network with the synced pulse state signal. The controller includes an intermodulation distortion (IMD) control module configured to receive the sync active signal, and generate an IMD control signal based on the sync active signal to control a frequency of the RF power signal. The RF power source is configured to output the RF power signal to a matching network, and where the controller is configured to output the sync active signal to the matching network for controlling the matching network. The at least one of the state transitions is a first state transition, and where the controller is configured to adjust a second state transition of the pulse based on the adjustment of the first state transition. Implementations of the described techniques may include hardware, a method or process, or computer software on a computer-accessible medium.

One general aspect includes a non transitory computer-readable medium storing processor-executable instructions for controlling a RF generator of a power supply system that outputs a RF power signal. The non-transitory computer readable medium storing processor executable instructions also includes generating a pulse to modulate the RF power signal of the RF power source, the pulse including one or more state transitions. The instructions also include receiving a sync signal indicative of one or more operating characteristics or parameters of an other RF generator. The instructions also include adjusting at least one of the state transitions of the pulse to synchronize the state transition with a defined phase of the received sync signal. Other embodiments of this aspect include corresponding computer systems, apparatus, and computer programs recorded on one or more computer storage devices, each configured to perform the actions of the methods.

Implementations may include one or more of the following features. The non-transitory computer-readable medium storing processor-executable instructions where the sync signal is a square waveform generated by the other RF generator. The sync signal changes states at zero crossings of an RF power signal from the other RF generator. The non-transitory computer-readable medium storing processor-executable instructions may include receiving the sync signal and generate a sync active signal based on the defined phase of the sync signal. The non-transitory computer-readable medium storing processor-executable instructions may include receiving a pulse state signal indicative of a desired state transition of the pulse, and in response to receiving the sync active signal, outputting a synced pulse state signal based on the pulse state signal to adjust the at least one of the state transitions of the pulse. The non-transitory computer-readable medium storing processor-executable instructions may include receiving the synced pulse state signal and generating a control signal for controlling the pulse in accordance with the synched pulse state signal. The non-transitory computer-readable medium storing processor-executable instructions may include outputting the synced pulse state signal to a second RF generator to activate a pulse shaping mode in the second RF generator. The non-transitory computer-readable medium storing processor-executable instructions may include outputting the synced pulse state signal to a matching network to align tuning of the matching network with the synced pulse state signal. The non-transitory computer-readable medium storing processor-executable instructions may include receiving the sync active signal and generating an IMD control signal based on the sync active signal to control a frequency of the RF power signal. The non-transitory computer-readable medium storing processor-executable instructions may include outputting the sync active signal to a matching network for controlling a matching network. The at least one of the state transitions is a first state transition, and may include adjusting a second state transition of the pulse based on the adjustment of the first state transition. Implementations of the described techniques may include hardware, a method or process, or computer software on a computer-accessible medium.

One general aspect includes a method for controlling a RF generator of a power supply system. The method also includes generating a pulse to modulate a RF power signal output by the RF power source, the pulse including one or more state transitions. The method also includes receiving a sync signal indicative of one or more operating characteristics or parameters of an other RF generator. The method also includes adjusting at least one of the state transitions of the pulse to synchronize the state transition with a defined phase of the received sync signal. Other embodiments of this aspect include corresponding computer systems, apparatus, and computer programs recorded on one or more computer storage devices, each configured to perform the actions of the methods.

Implementations may include one or more of the following features. The method where the sync signal is a square waveform generated by the other RF generator. The sync signal changes states at zero crossings of an RF power signal from the other RF generator. The method may include receiving the sync signal and generate a sync active signal based on the defined phase of the sync signal. The method may include receiving a pulse state signal indicative of a desired state transition of the pulse, and in response to receiving the sync active signal, outputting a synced pulse state signal based on the pulse state signal to adjust the at least one of the state transitions of the pulse. The method may include receiving the synced pulse state signal and generating a control signal for controlling the pulse in accordance with the synched pulse state signal. The method may include outputting the synced pulse state signal to a second RF generator to activate a pulse shaping mode in the second RF generator. The method may include outputting the synced pulse state signal to a matching network to align tuning of the matching network with the synced pulse state signal. The method may include receiving the sync active signal and generating an IMD control signal based on the sync active signal to control a frequency of the RF power signal. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

DRAWINGS

The present disclosure will become more fully understood from the detailed description and the accompanying drawings.

Figure 7:
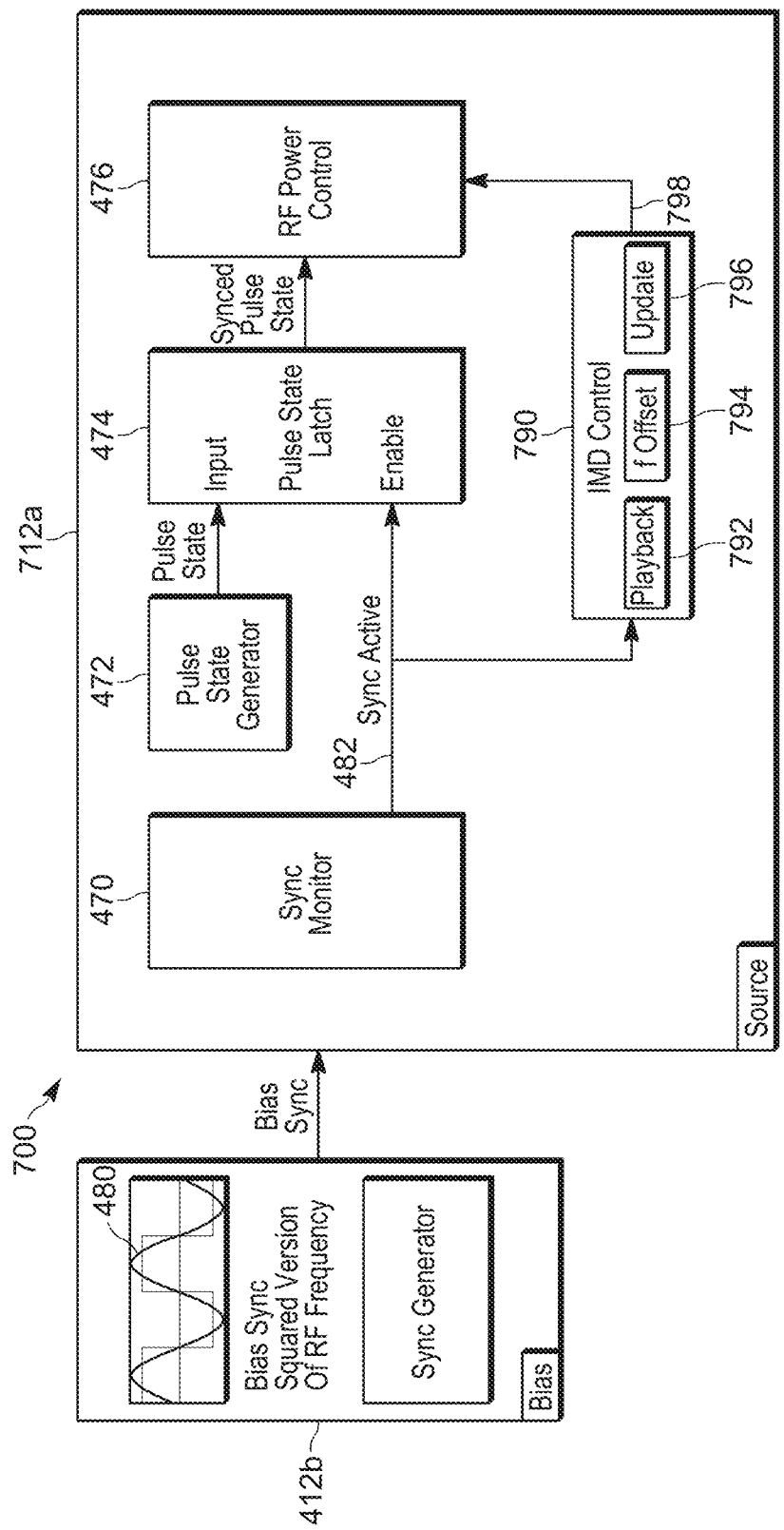
Figure 8:
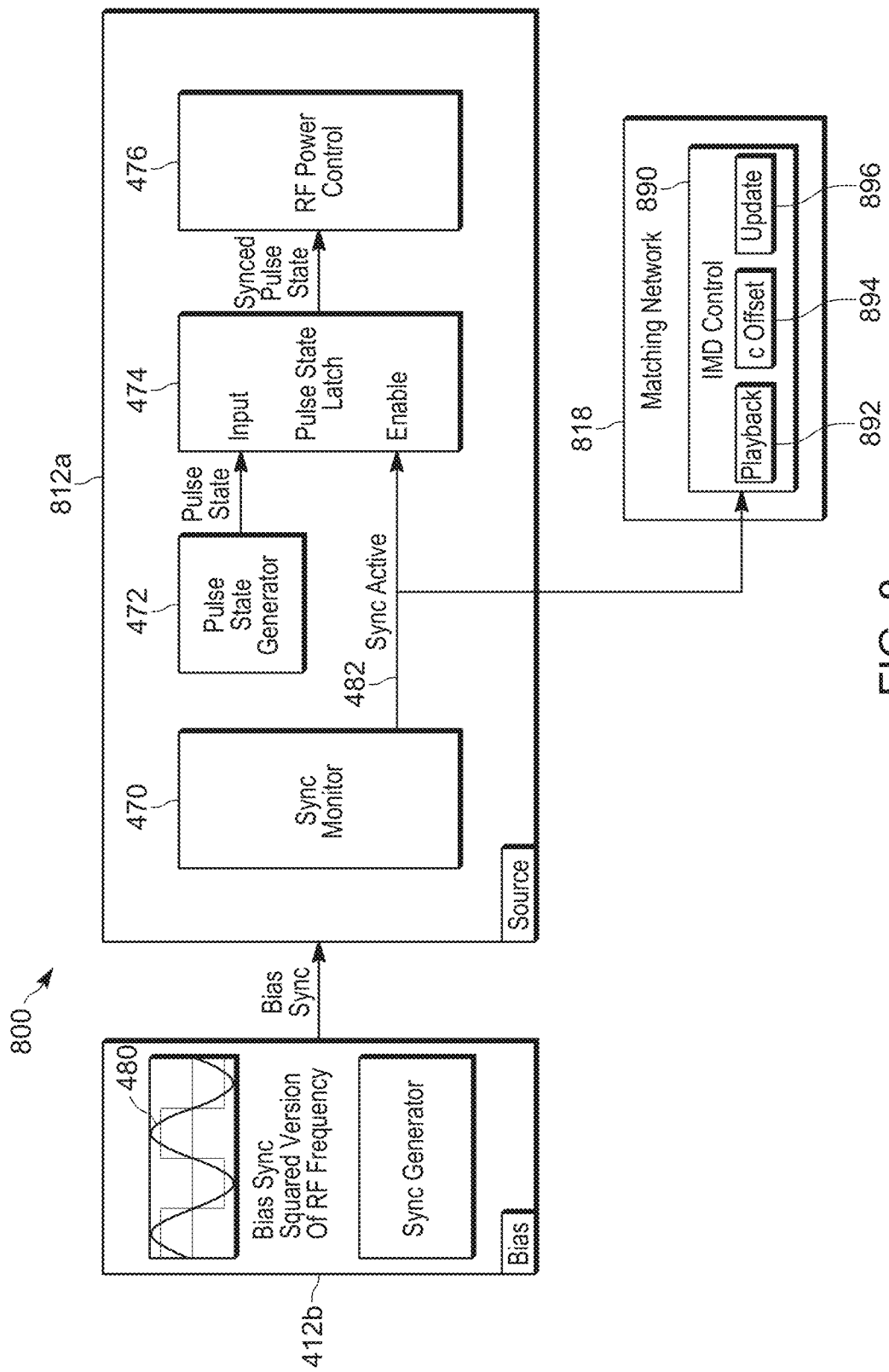
Figure 9:
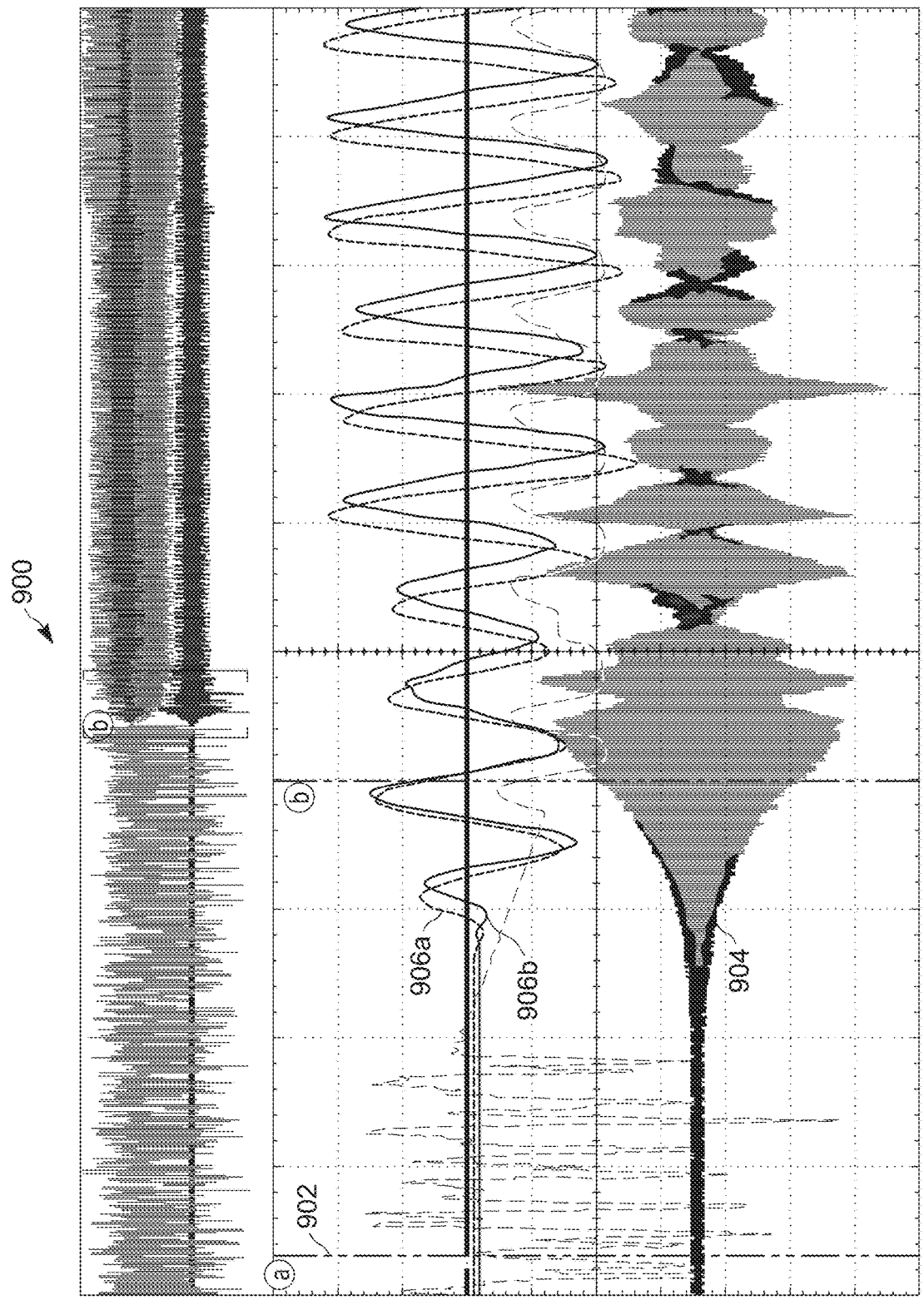
Figure 10:
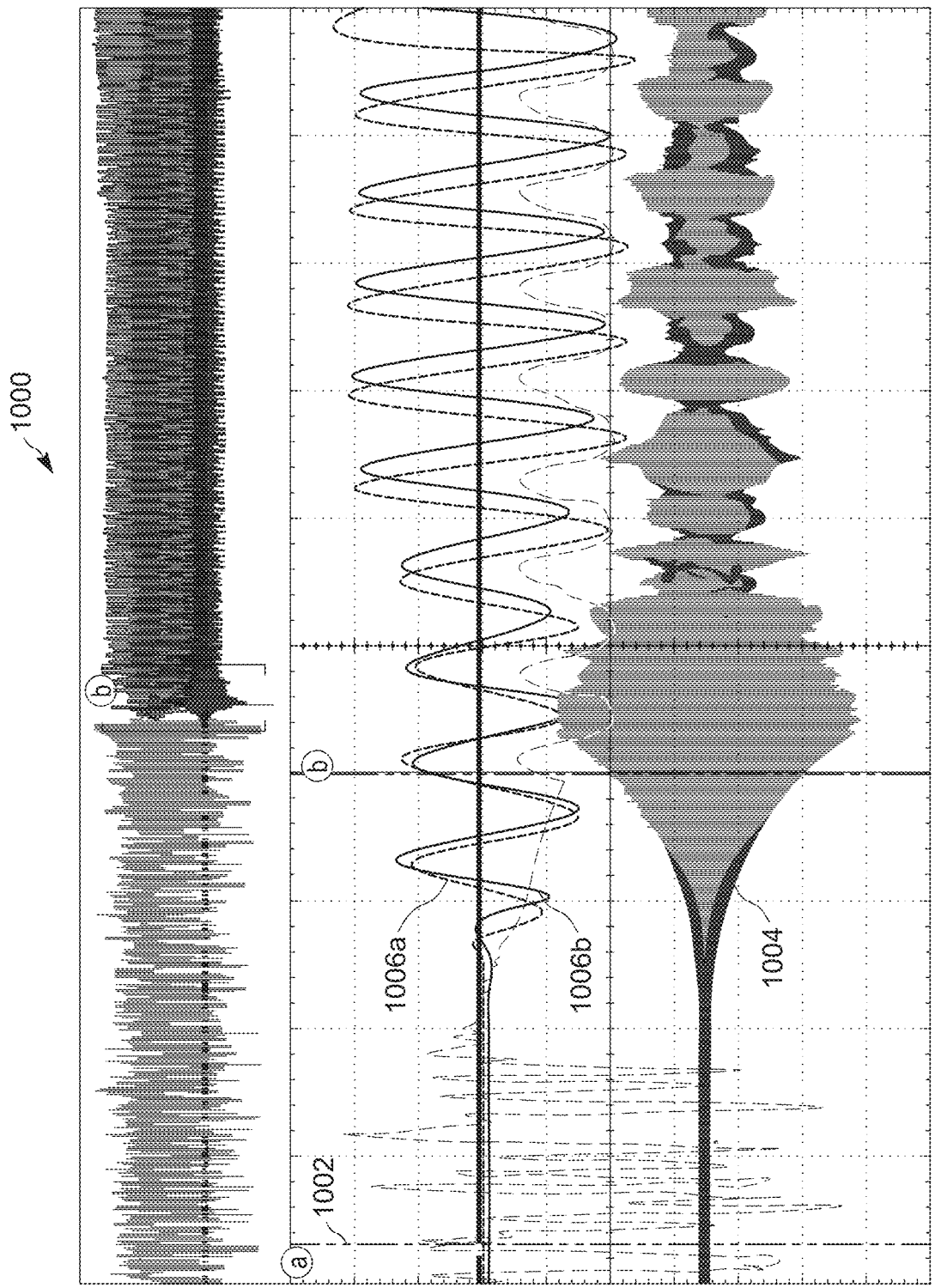
Figure 11:
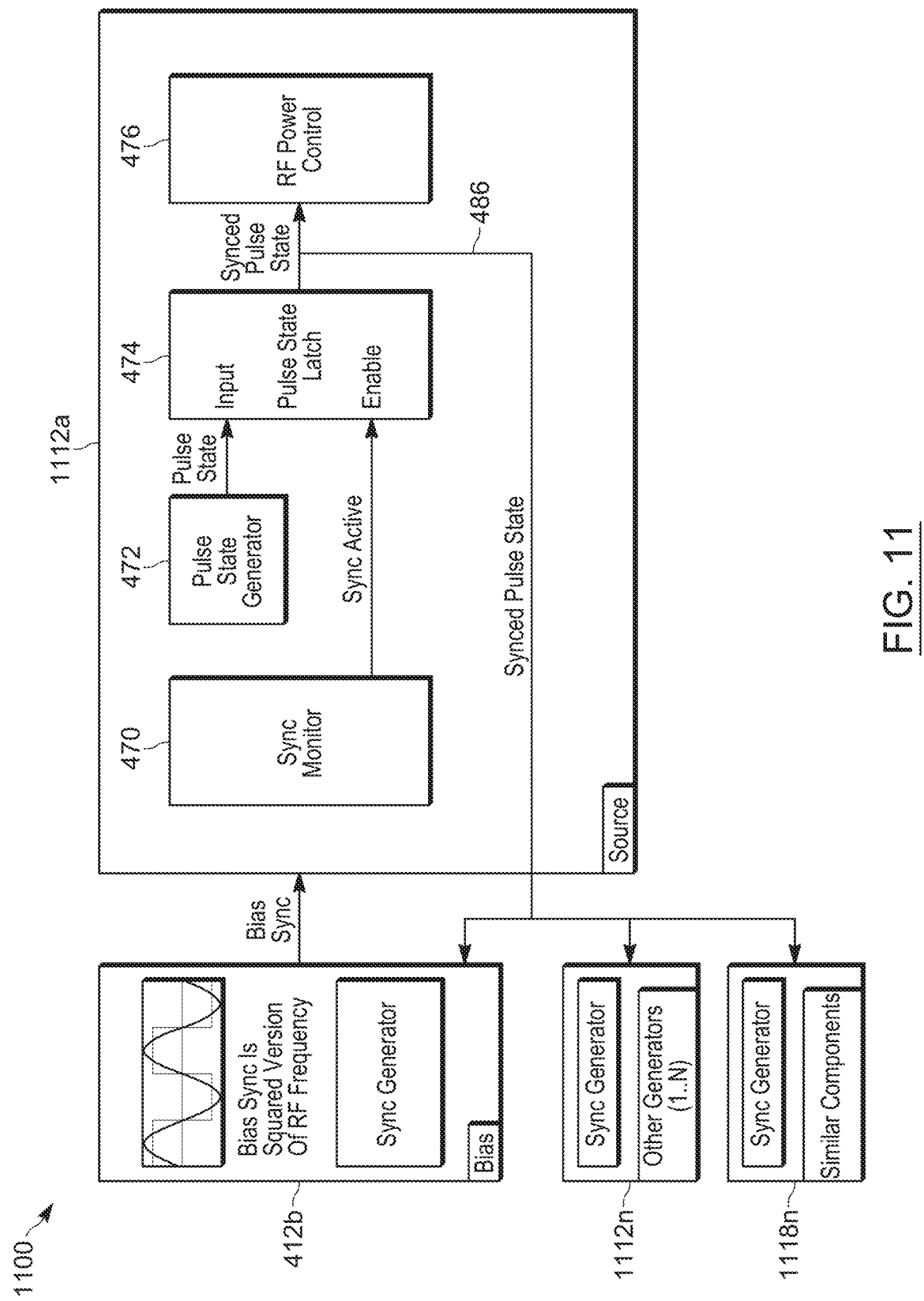
Figure 12:
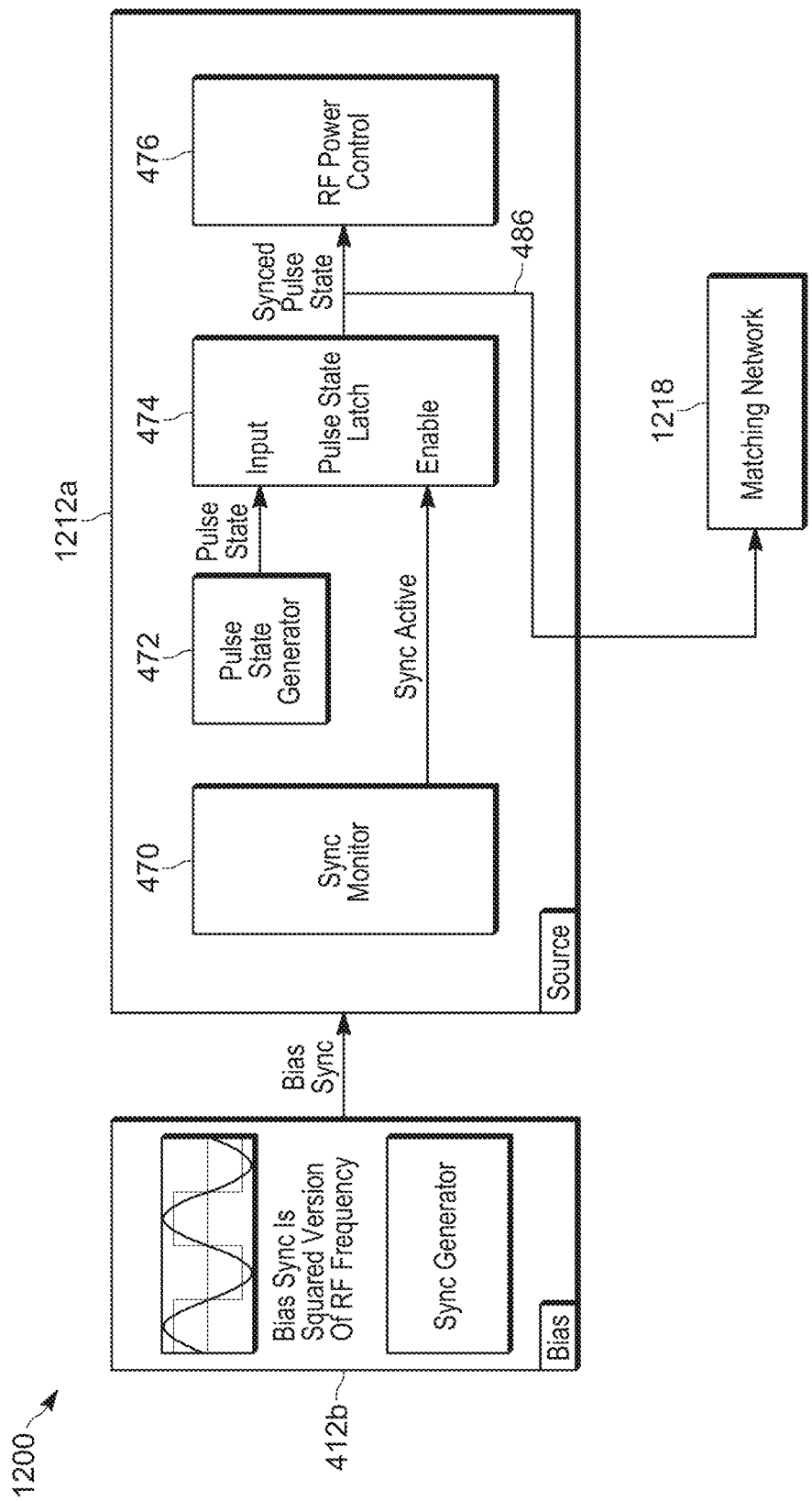
Figure 13:
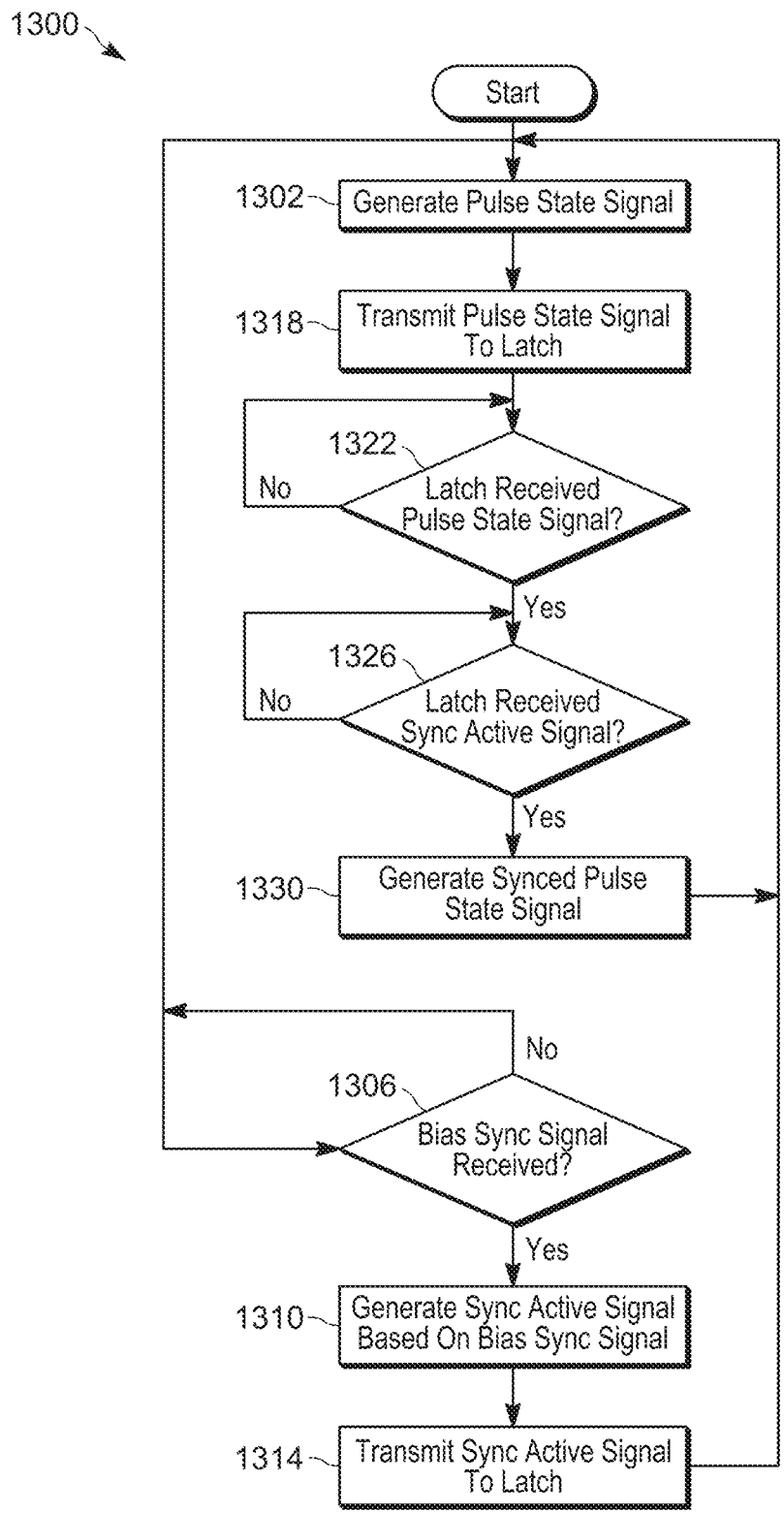
Figure 14:
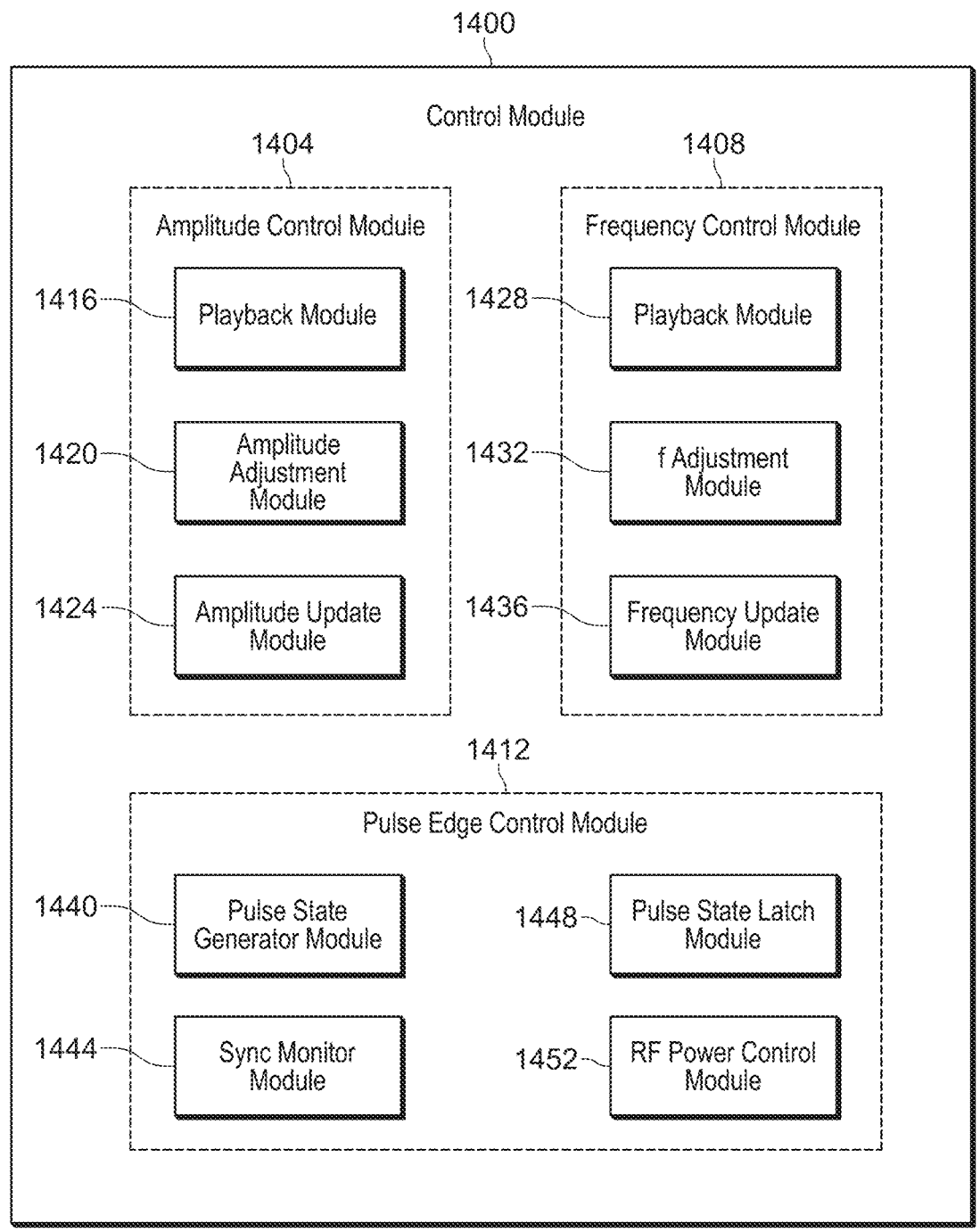

FIGS. 6A-D show waveforms of pulse edges synchronized with defined phases of bias signals according to various embodiments of the present disclosure;

FIG. 7 is a schematic diagram of a power delivery system including an RF generator having a controller for synchronizing a pulse edge with a defined phase of a bias signal and mitigating IMD according to various embodiments of the present disclosure;

FIG. 8 is a schematic diagram of a power delivery system including an RF generator having a controller for synchronizing a pulse edge with a defined phase of a bias signal and a matching network for mitigating IMD according to various embodiments of the present disclosure;

FIGS. 9 and 10 show waveforms of pulse edges synchronized with defined phases of bias signals when IMD mitigation techniques are employed according to various embodiments of the present disclosure;

FIG. 11 is a schematic diagram of a power delivery system including an RF generator having a controller for synchronizing a pulse edge with a defined phase of a bias signal and providing synced pulse state signals to other generators and/or components according to various embodiments of the present disclosure;

FIG. 12 is a schematic diagram of a power delivery system including an RF generator having a controller for synchronizing a pulse edge with a defined phase of a bias signal and providing a synced pulse state signal to a matching network according to various embodiments of the present disclosure;

FIG. 13 shows a flow chart of operation of a control system for performing pulse edge adjustment control arranged in accordance with the principles of the present disclosure; and FIG. 14 shows a functional block diagram of an example control module arranged in accordance with various embodiments.

In the drawings, reference numbers may be reused to identify similar and/or identical elements.

DETAILED DESCRIPTION

Example embodiments will now be described more fully with reference to the accompanying drawings.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power" or "reflected power"). The net power delivered to the plasma is called "delivered power," and is calculated as delivered power=forward power−reflected power. Forward and delivered power may be maximized and reverse power may be minimized when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by amplitude, frequency and phase. The relative amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closedloop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. Pat. No. 10,821,542, issued Nov. 3, 2020 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent, the pulsing of a second RF generator is controlled in accordance with detecting at the second RF generator the pulsing of a first RF generator, thereby synchronizing pulsing between the two RF generators.

Figure 1:
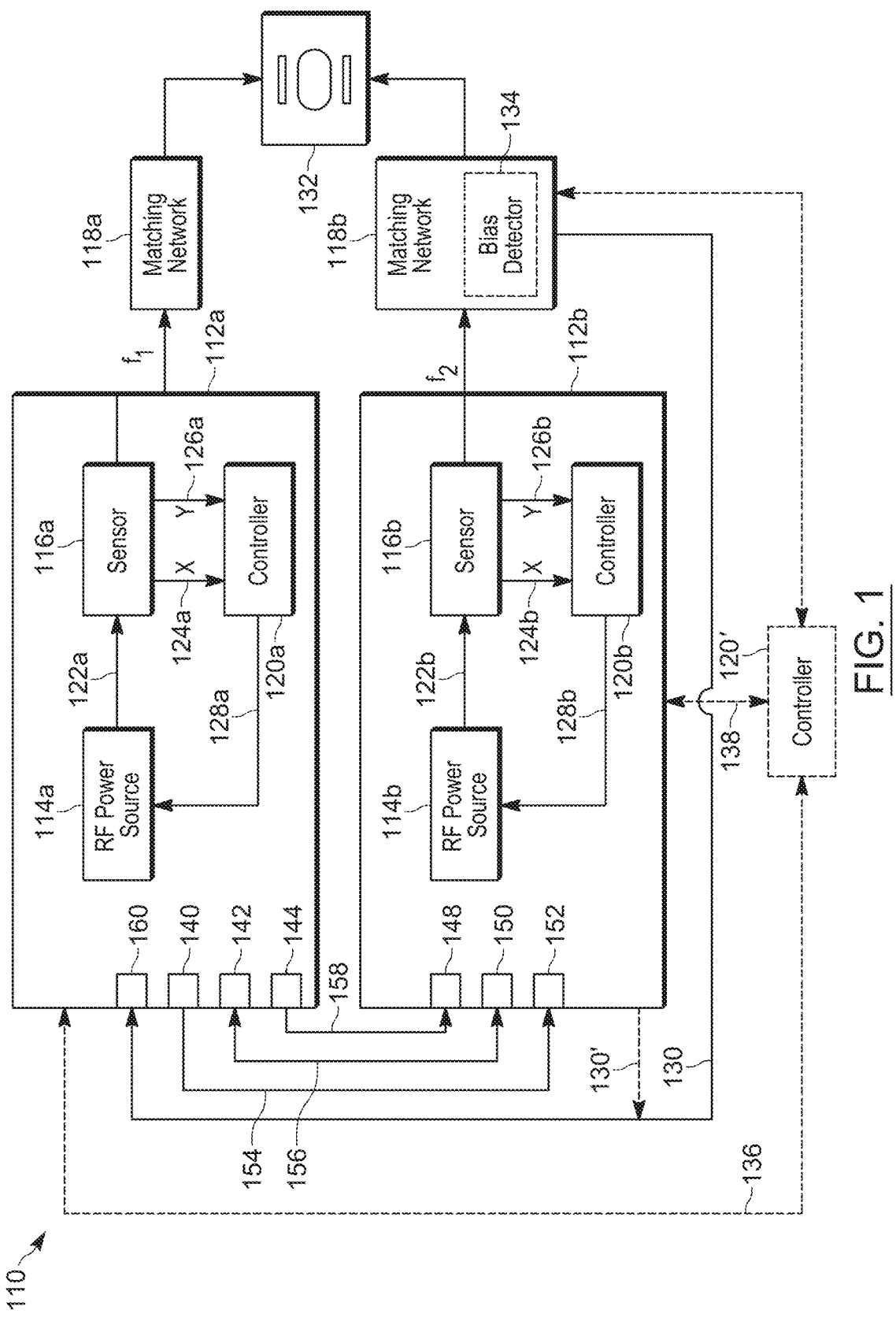
FIG. 1 is a schematic diagram of a power delivery system having multiple power supplies arranged according to various embodiments of the present disclosure.

FIG. 1 depicts a power supply system 110. Power supply system 110 includes a pair of RF generators 112$a$, 112$b$, also referred to as power supplies, matching networks 118$a$, 118$b$, and a load 132, such as a non-linear load, which may be a plasma chamber, process chamber, and the like. In various embodiments, RF generator 112$a$ is referred to as a source RF generator or power supply, and matching network 118$a$ is referred to as a source matching network. Also in various embodiments, RF generator 112$b$ is referred to as a bias RF generator or power supply, and matching network 118$b$ is referred to as a bias matching network. It will be understood that the components can be referenced individually or collectively using the reference number without a letter subscript or a prime symbol.

In various embodiments, source RF generator 112$a$ receives a control signal 130 from matching network 118$b$, or a control signal 130' from bias RF generator 112$b$. As will be explained in greater detail, control signal 130 or 130' represents an input signal to source RF generator 112$a$ that indicates one or more operating characteristics or parameters of bias RF generator 112$b$. In various embodiments, a synchronization bias detector 134 senses the RF signal output from matching network 118$b$ to load 132 and outputs a synchronization or trigger signal 130 to source RF generator 112$a$. In various embodiments, synchronization or trigger signal 130' may be output from bias RF generator 112$b$ to source RF generator 112$a$, rather than trigger signal 130. A difference between trigger or synchronization signals 130, 130' may result from the effect of matching network 118$b$, which can adjust the phase between the input signal to and output signal from matching network. Signals 130, 130' include information about the operation of bias RF generator 112$b$ that in various embodiments enables predictive responsiveness to address periodic fluctuations in the impedance of load 132 caused by bias RF generator 112$b$. When control signals 130 or 130' are absent, RF generators 112$a$, 112$b$ operate autonomously.

RF generators 112$a$, 112$b$ include respective RF power sources or amplifiers 114$a$, 114$b$, RF sensors 116$a$, 116$b$, and processors, controllers, or control modules 120$a$, 120$b$. RF power sources 114$a$, 114$b$ generate respective RF power signals 122$a$, 122$b$ output to respective sensors 116$a$, 116$b$. Sensors 116$a$, 116$b$ receive the output of RF power sources 114$a$, 114$b$ and generate respective RF output signals or RF power signals $f_1$ and $f_2$. Sensors 116$a$, 116$b$ also output signals that vary in accordance with various parameters sensed from load 132. While sensors 116$a$, 116$b$, are shown within respective RF generators 112$a$, 112$b$, RF sensors 116$a$, 116$b$ can be located externally to the RF power generators 112$a$, 112$b$. Such external sensing can occur at the output of the RF generator, at the input of an impedance matching device located between the RF generator and the load, or between the output of the impedance matching device (including within the impedance matching device) and the load.

Sensors 116$a$, 116$b$ detect various operating parameters and output signals X and Y. Sensors 116$a$, 116$b$ may include voltage, current, and/or directional coupler sensors. Sensors 116$a$, 116$b$ may detect (i) voltage V and current I and/or (ii) forward power $P_{FWD}$ output from respective power amplifiers 114$a$, 114$b$ and/or RF generators 112$a$, 112$b$ and reverse or reflected power $P_{REV}$ received from respective matching network 118$a$, 118$b$ or load 132 connected to respective sensors 116$a$, 116$b$. The voltage V, current I, forward power $P_{FWD}$, and reverse power $P_{REV}$ may be scaled, filtered, or scaled and filtered versions of the actual voltage, current, forward power, and reverse power associated with the respective power sources 114$a$, 114$b$. Sensors 116$a$, 116$b$ may be analog or digital sensors or a combination thereof. In a digital implementation, the sensors 116$a$, 116$b$ may include analog-to-digital (A/D) converters and signal sampling components with corresponding sampling rates. Signals X and Y can represent any of the voltage V and current I or forward (or source) power $P_{FWD}$ and reverse (or reflected) power $P_{REV}$.

Sensors 116$a$, 116$b$ generate sensor signals X, Y, which are received by respective controllers or power control modules 120$a$, 120$b$. Power control modules 120$a$, 120$b$ process the respective X, Y signals 124$a$, 126$a$ and 124$b$, 126*b* and generate one or a plurality of feedforward or feedback control signals 128*a*, 128*b* to respective power sources 114*a*, 114*b*. Power sources 114*a*, 114*b* adjust the RF power signals 122*a*, 122*b* based on the received one or plurality feedback or feedforward control signal. In various embodiments, power control modules 120*a*, 120*b* may control matching networks 118*a*, 118*b*, respectively, via respective control signals. Power control modules 120*a*, 120*b* may include, at least, proportional integral derivative (PID) controllers or subsets thereof and/or direct digital synthesis (DDS) component(s) and/or any of the various components described below in connection with the modules.

In various embodiments, source matching network 118*a* and bias matching network 118*b* may be separate components as shown in FIG. 1. Alternatively, matching networks 118*a*, 118*b* may be combined. In such embodiments, RF power signals may be combined in parallel before sending them to load 132 (e.g., one or a plurality of electrodes of load 132).

In various embodiments, power control modules 120*a*, 120*b* are PID controllers or subsets thereof and may include functions, processes, processors, or submodules. Control signals 128*a*, 128*b* may be drive signals and may include DC offset or rail voltage, voltage or current magnitude, frequency, and phase components. In various embodiments, feedback control signals 128*a*, 128*b* can be used as inputs to one or multiple control loops. In various embodiments, the multiple control loops can include a proportional-integral-derivative (PID) control loop for RF drive, and for rail voltage. In various embodiments, control signals 128*a*, 128*b* can be used in a Multiple Input Multiple Output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein. In other embodiments, signals 128*a*, 128*b* can provide feedforward control as described in U.S. Pat. No. 10,049,857, assigned to the assignee of the present application and incorporated by reference herein.

In various embodiments, power supply system 110 can include controller 120', also referred to a processor or a control module. Controller 120' may be disposed externally to either or both of RF generators 112*a*, 112*b* and may be referred to as external or common controller 120'. In various embodiments, controller 120' may implement one or a plurality of functions, processes, or algorithms described herein with respect to one or both of controllers 120*a*, 120*b*. Accordingly, controller 120' communicates with respective RF generators 112*a*, 112*b* via a pair of respective links 136, 138 which enable exchange of data and control signals, as appropriate, between controller 120' and RF generators 112*a*, 112*b*. For the various embodiments, controllers 120*a*, 120*b*, 120' can distributively and cooperatively provide analysis and control along with RF generators 112*a*, 112*b*. In various other embodiments, controller 120' can provide control of RF generators 112*a*, 112*b*, eliminating the need for the respective local controllers 120*a*, 120*b*.

In various embodiments, RF power source 114*a*, sensor 116*a*, controller 120*a*, and matching network 118*a* can be referred to as source RF power source 114*a*, source sensor 116*a*, source controller 120*a*, and source matching network 118*a*. Similarly in various embodiments, RF power source 114*b*, sensor 116*b*, controller 120*b*, and matching network 118*b* can be referred to as bias RF power source 114*b*, bias sensor 116*b*, bias controller 120*b*, and bias matching network 118*b*. In various embodiments and as described above, the source term refers to the RF generator that generates a plasma, and the bias term refers to the RF generator that tunes the plasma Ion Energy Distribution Function (IEDF). In various embodiments, the source and bias RF power supplies operate at different frequencies. In various embodiments, the source RF power supply operates at a higher frequency than the bias RF power supply. In various other embodiments, the source and bias RF power supplies operate at the same frequencies or substantially the same frequencies.

According to various embodiments, source RF generator 112*a* and bias RF generator 112*b* include multiple ports to communicate externally. Source RF generator 112*a* includes pulse synchronization output port 140, digital communication port 142, RF output port 144, and control signal port 160. Bias RF generator 112*b* includes RF input port 148, digital communication port 150, and pulse synchronization input port 152. Pulse synchronization output port 140 outputs pulse synchronization signal 154 to pulse synchronization input port 152 of bias RF generator 112*b*. Digital communication port 142 of source RF generator 112*a* and digital communication port 150 of bias RF generator 112*b* communicate via digital communication link 156. Control signal port 160 of source RF generator 112*a* receives control signal 130 and/or 130'. RF output port 144 generates RF control signal 158 input to RF input port 148. In various embodiments, RF control signal 158 is substantially the same as the RF control signal controlling source RF generator 112*a*. In various other embodiments, RF control signal 158 is the same as the RF control signal controlling source RF generator 112*a*, but is phase shifted within source RF generator 112*a* in accordance with a requested phase shift generated by bias RF generator 112*b*. Thus, in various embodiments, source RF generator 112*a* and bias RF generator 112*b* are driven by substantially identical RF control signals or by substantially identical RF control signal phase shifted by a predetermined amount.

Figure 2:
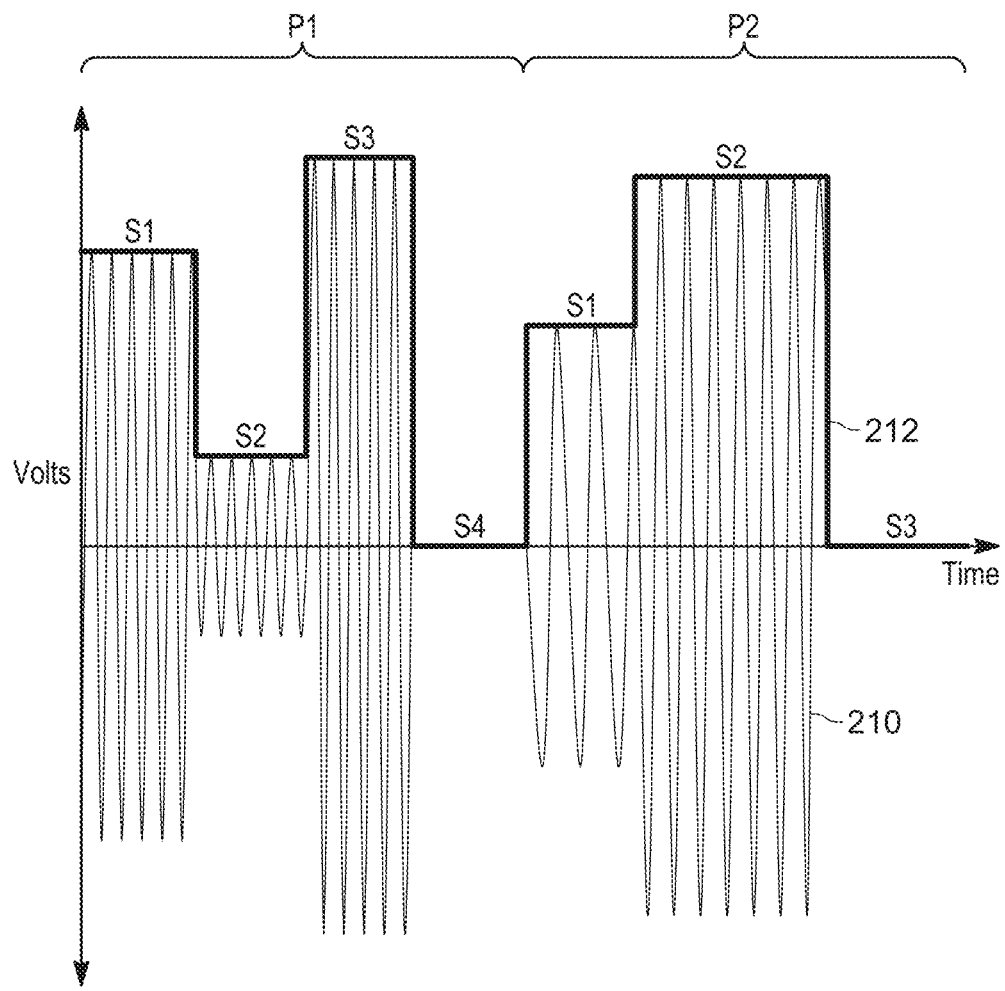
FIG. 2 shows waveforms of a RF signal and a pulse modulating the RF signal.

FIG. 2 depicts a plot of voltage versus time to describe a pulse mode of operation for delivering power to a load, such as load 132 of FIG. 1. More particularly, FIG. 2 depicts two-multistate pulses P1, P2 of a pulse signal 212 having a respective plurality of states S1-S4 and S1-S3. In FIG. 2, RF signal 210 is modulated by pulses P1 and P2. As shown at states S1-S3 of P1 and S1-S2 of P2, when the pulses are ON, RF generator 112 outputs RF signal 210 having an amplitude defined by the pulse magnitude at each state. Conversely, during states S4 of P1 and S3 of P2, the pulses are OFF, and RF generator 112 does not output RF signal 210. Pulses P1, P2 can repeat at a constant duty cycle or a variable duty cycle, and states S1-S4 of each pulse P1, P2 may have the same or varying amplitudes and widths. Further, pulse signal 212 need not be embodied as a square wave as shown in FIG. 2. By way of non-limiting example, pulse 212 may be trapezoidal, triangular, or gaussian in shape. Further yet, pulses P1, P2 can have multiple states S1, . . . , Sn of varying amplitude, duration, and shape. States S1, . . . , Sn may repeat within a fixed or variable period. Also shown in FIG. 2, RF signal 210 operates at a frequency that varies between states or within a state.

In many cases, it is desirable to align RF power signals from RF power generators, such as source RF generator 112*a* and bias RF generator 112*b* of FIG. 1. For example, by aligning the RF power signal from a bias RF generator to the RF power signal from a source RF generator, power delivered to a load (e.g., load 132 of FIG. 1) and ion energy associated with the load may be more repeatable.

When pulses are used to modulate the RF power signals, synchronization between the bias RF power signals and pulse edges may not occur. For example, the bias RF generator may provide the bias RF power signal at random or arbitrary phases at the pulse edges. This randomness of the phase between the bias RF power signal and the pulse edges may hinder achieving pulse-to-pulse repeatability.

Figure 3:
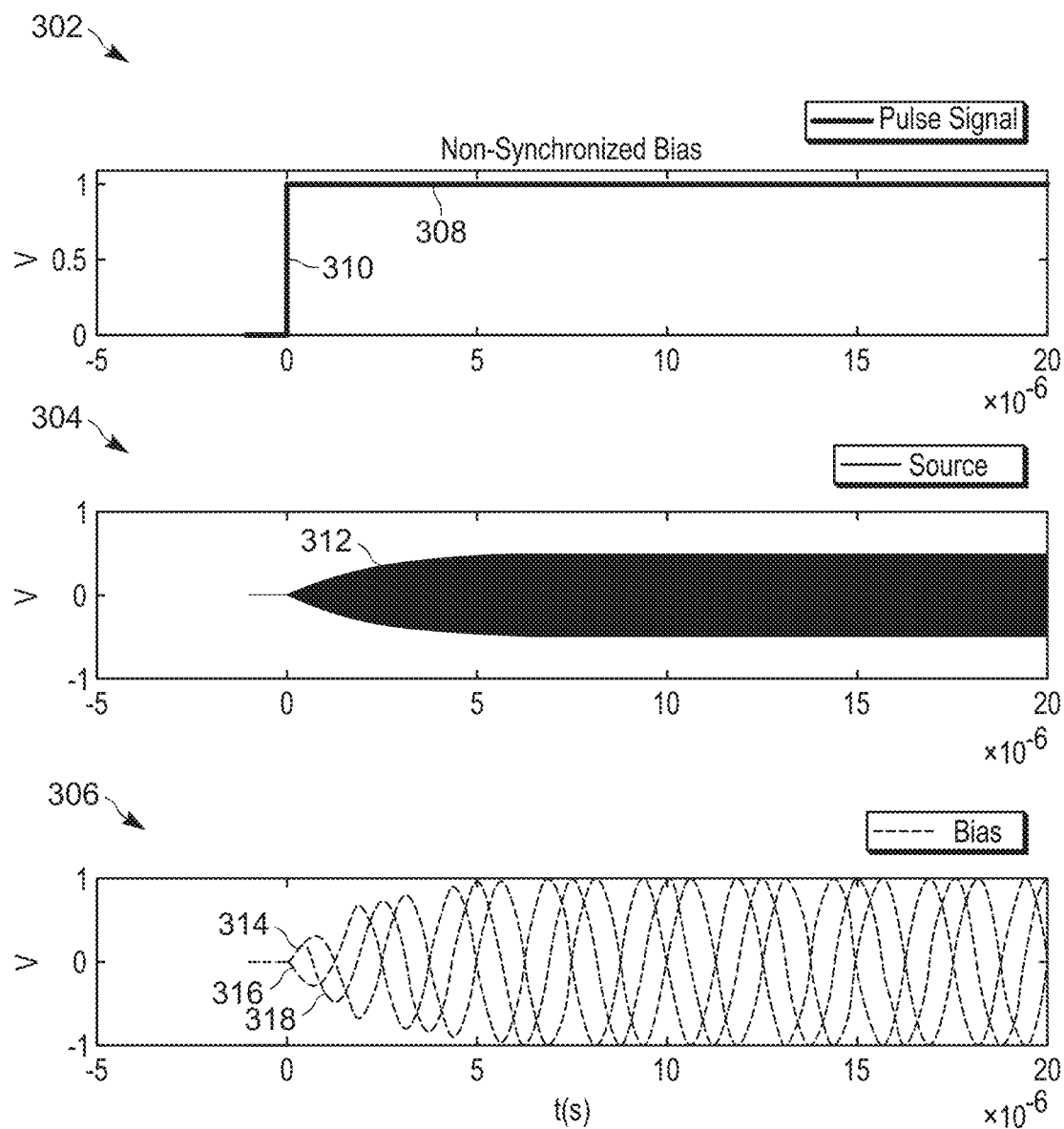
FIG. 3 shows waveforms of bias signals when no synchronization is present between a pulse transition or a state transition of a pulse and the bias signals.

For example, FIG. 3 depicts plots 302, 304, 306 of voltage versus time to show the randomness of bias RF power signals. Specifically, plot 302 includes pulse signal 308, plot 304 includes source signal 312, and plot 306 includes bias signals 314, 316, 318. The frequency of bias signals 314, 316, 318 is lower than the frequency of source signal 312. Each bias signal 314, 316, 318 corresponds to a different instance of the bias RF generator providing power when pulse signal 308 changes state at pulse edge 310. For example, after the pulse signal 308 changes state at pulse edge 310, the source RF generator outputs RF power represented by signal 312 and the bias RF generator outputs RF power represented by signal 314 or signal 316 or signal 318. As shown, bias signals 314, 316, 318, and therefore RF power from the bias generator, begin at random or arbitrary phases with respect to pulse edge 310.

In the example of FIG. 3, the state transition at pulse edge 310 occurs at the start of the pulse signal 308. In other examples, the state transition(s) may occur within the pulse signal 308. For example, the pulse signal 308 may include multiple states, such as states S1-S4 in FIG. 2. In such examples, the randomness of the bias signal may occur at the start of the pulse signal 308, at one or more of the transitions between states, etc.

The randomness of a bias RF power signal with respect to a pulse edge may be substantially eliminated by synchronizing a pulse edge with a defined phase of the bias signal. For example, at least one state transition of the pulse (e.g., the start of the pulse, a transition between states within a pulse, etc.) may be adjusted to synchronize with a defined phase of the bias RF power signal. This adjustability of the pulse ensures one or more pulse edges occur at specific phases of the bias. For instance, a state transition may occur at a 0 degree phase, a 90 degree phase, 180 degree phase, etc. of the bias. As a result of synchronizing the transition with a defined phase of the bias signal, power delivered to a load and plasma properties such as ion energy associated with the load may be more repeatable.

Additionally, adjustment and control of the pulse may be achieved with a controller associated with a source RF generator, such as the source RF generator 112a of FIG. 1. In such examples, the controller associated with the source RF generator may receive a sync signal indicative of a RF signal from another RF generator, such as the RF bias generator 112b of FIG. 1, and adjust at least one of the state transitions of the pulse to synchronize the transition with a defined phase of the received sync signal. This adjusted pulse may then be employed by the source and bias RF generators. As such, synchronization may occur between RF signals from the source and bias RF generators, and between pulse edge(s) and the bias RF signal.

Figure 4:
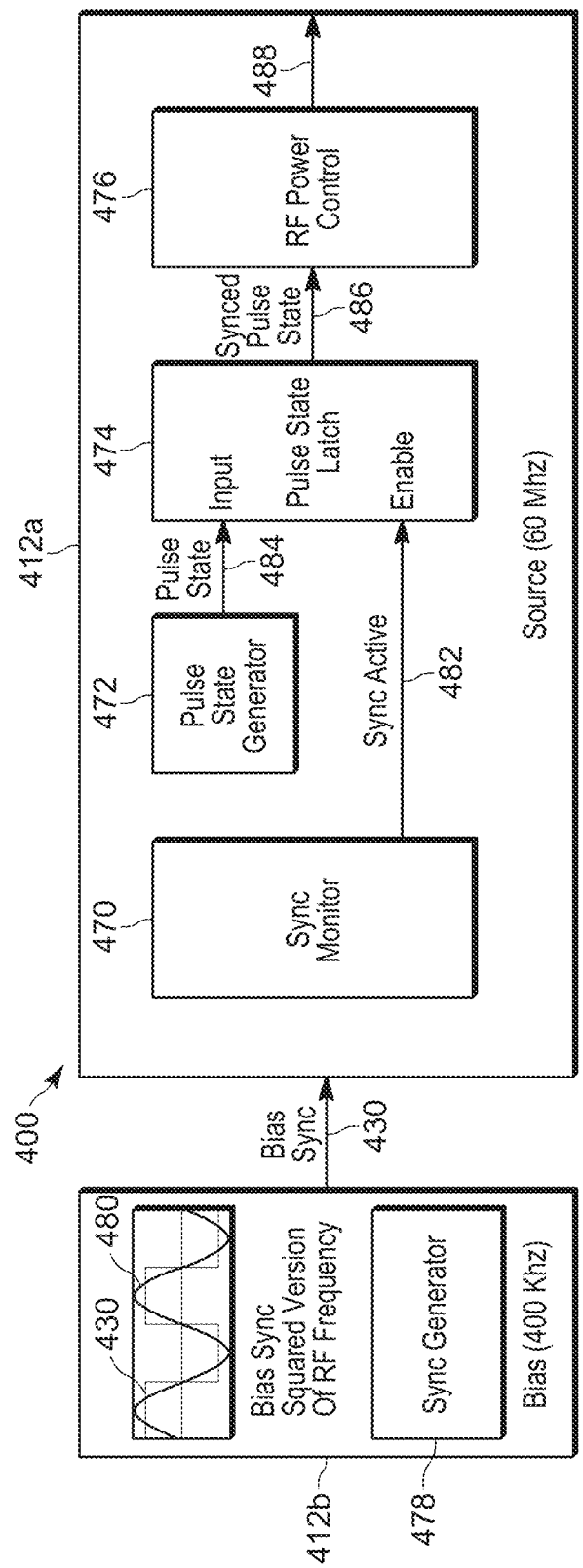
FIG. 4 is a schematic diagram of a power delivery system including an RF generator having a controller for synchronizing a pulse edge with a defined phase of a bias sync signal according to various embodiments of the present disclosure.

FIG. 4 depicts one example implementation of RF power delivery system 400 for synchronizing a pulse edge with a defined phase of the bias signal. Specifically, FIG. 4 depicts RF power delivery system 400 as including source RF generator 412a and bias RF generator 412b, both of which may be as described above with respect to generators 112a, 112b of FIG. 1. For example, although not shown in FIG. 4, RF generators 412a, 412b may include RF power sources, sensors, etc. to provide RF signals to matching networks, etc. as described above with respect to FIG. 1.

In the example of FIG. 4, RF generators 412a, 412b include controllers, both of which may be as described above with respect to controllers 120a, 120b of FIG. 1. Additionally, the controller of bias RF generator 412b includes sync generator module 478, and the controller of source RF generator 412a includes sync monitor module 470, pulse state generator module 472, pulse state latch module 474, and RF power control module 476. As shown in FIG. 4, pulse state latch module 474 is in communication with sync monitor module 470, pulse state generator module 472, and RF power control module 476. In various embodiments, sync monitor module 470, pulse state generator module 472, pulse state latch module 474, and RF power control module 476 may be embodied in a pulse edge control module within the controller.

In various embodiments, source RF generator 412a receives bias sync signal 430, as shown in FIG. 4. Bias sync signal 430 may be similar to control signal 130 or 130' of FIG. 1 in that it represents an input signal to source RF generator 412a that indicates one or more operating characteristics or parameters of bias RF generator 412b. In various embodiments, bias sync signal 430 may be considered a synchronization or trigger signal as explained above relative to signal 130 or 130'.

In the example of FIG. 4, bias sync signal 430 is a square waveform of a sinusoidal bias signal 480 indicative of one or more operating characteristics or parameters of bias RF generator 412b, as shown in FIG. 4. In some examples, bias signal 480 may be representative of a RF power signal. The square waveform signal 430 may be based on the frequency and phase of bias signal 480. For instance, the square waveform signal 430 may transition states (e.g., high to low, low to high, switch polarities, etc.) at zero crossings of the sinusoidal bias signal 480, as shown in FIG. 4.

Bias sync signal 430 may be generated and provided from bias RF generator 412b. Specifically, in the example of FIG. 4, sync generator module 478 of bias RF generator 412b generates bias sync signal 430 (and/or bias signal 480). In various embodiments, sync generator module 478 may include, for example, a synthesizer or the like for generating bias sync signal 430 (and/or bias signal 480). In other examples, bias sync signal 430 (and/or bias signal 480) may be generated at a matching network, such as matching network 118b of FIG. 1.

In various embodiments, bias sync signal 430 (and/or bias signal 480) may be another suitable signal generated by bias RF generator 412b, a matching network, and/or another suitable source. For example, bias RF generator 412b, a matching network, and/or another suitable source may generate a timing signal, a repeating interrupt signal, a repeating impulse signal, etc. that is indicative of one or more operating characteristics or parameters of bias RF generator 412b. In some examples, the other signal source may be a signal generator module located externally or internally to source RF generator 412a, bias RF generator 412b, or a matching network.

In various embodiments, the controller of source RF generator 412a receives bias sync signal 430, and generates sync active signal 482 based on a defined phase of bias sync signal 430. Sync active signal 482 may be generated during each cycle of bias sync signal 430 (e.g., at a defined phase of each cycle of bias sync signal 430). For example, in FIG. 4, sync monitor module 470 receives bias sync signal 430 from bias RF generator 412b, and imposes a desired time adjustment to bias sync signal 430 based on the defined phase (e.g., 0 degrees, 90 degrees, 120 degrees, 180 degrees, etc.). After the adjustment, sync monitor module 470 generates sync active signal 482 for pulse state latch module 474. For example, sync active signal 482 may represent a time delayed bias sync signal 430 provided to pulse state latch module 474.

In some examples, sync monitor module 470 may additionally analyze the received bias sync signal 430. For example, sync monitor module 470 may ensure bias sync signal 430 is valid, sufficiently clean, etc. for imposing the desired time adjustment, synchronizing a pulse edge with the defined phase of bias signal 480, etc.

In various embodiments, the controller of source RF generator 412a generates pulse state signal 484 for signifying a requested state transition of the pulse. For example, in FIG. 4, pulse state generator module 472 generates pulse state signal 484 for every requested state transition of the pulse, and provides pulse state signal 484 to pulse state latch module 474. In some examples, pulse state signal 484 may be generated according to a defined pulse rate and duty cycle as specified by, for example, a user of system 400.

As shown in FIG. 4, pulse state latch module 474 receives sync active signal 482 and pulse state signal 484, and outputs synced pulse state signal 486 to RF power control module 476 based on pulse state signal 484 to initiate a transition of the pulse. In various embodiments, pulse state latch module 474 delays outputting synced pulse state signal 486 until both sync active signal 482 and pulse state signal 484 are received. This adjustment ensures a state change of the pulse is aligned with the defined phase of bias sync signal 430 (and bias signal 480).

In various embodiments, pulse state latch module 474 receives pulse state signal 484 before sync active signal 482. In such embodiments, pulse state latch module 474 may output synced pulse state signal 486 in response to receiving sync active signal 482. In other embodiments, pulse state latch module 474 receives sync active signal 482 before pulse state signal 484. In such embodiments, pulse state latch module 474 may output synced pulse state signal 486 in response to receiving pulse state signal 484.

For example, pulse state latch module 474 may initially receive pulse state signal 484 indicating a request to change states (e.g., start the pulse, change states within the pulse, etc.). However, pulse state latch module 474 delays outputting synced pulse state signal 486 until it receives sync active signal 482 from sync monitor module 470. In other words, pulse state latch module 474 outputs synced pulse state signal 486 in response to receiving sync active signal 482. As such, pulse state latch module 474 adjusts or delays the transition of the pulse from the requested state change to a later time based on sync active signal 482. In such examples, a width of a state (e.g., one of the states S1-S4 of pulse P1 of FIG. 2 or one of the states S1-S3 of pulse P2 of FIG. 2) may be increased based on the adjusted or delayed transition.

In other embodiments, pulse state latch module 474 may adjust or advance the transition of the pulse toward a previous bias cycle. For example, synced pulse state 486 may be advanced toward a previous cycle of bias sync signal 430 rather than delayed to the next cycle. This may be useful where an edge of the previous bias cycle is closer to a pulse state change than an edge of the next bias cycle. For instance, sync active signal 482 may be provided to pulse state latch module 474 during each cycle of bias sync signal 430 (e.g., at a defined phase of each cycle of bias sync signal 430). Pulse state signal 484 may be controlled so that the signal is provided to pulse state latch module 474 earlier in time to adjust or advance the transition of the pulse toward a previous cycle of bias sync signal 430. In such examples, a width of a state (e.g., one of the states S1-S4 of pulse P1 of FIG. 2 or one of the states S1-S3 of pulse P2 of FIG. 2) may be decreased based on the adjusted or advanced transition.

In various embodiments, knowledge of an adjustment made in one state may be used to affect subsequent states. For example, when a state transition in a pulse is adjusted (e.g., delayed, advanced, etc.), a subsequent state transition in the pulse may be adjusted as desired based on the previous state transition. This subsequent adjustment may help prevent unnecessary added width in the subsequent state, ensure a desirable period of the pulse is satisfied, etc.

Figure 5A:
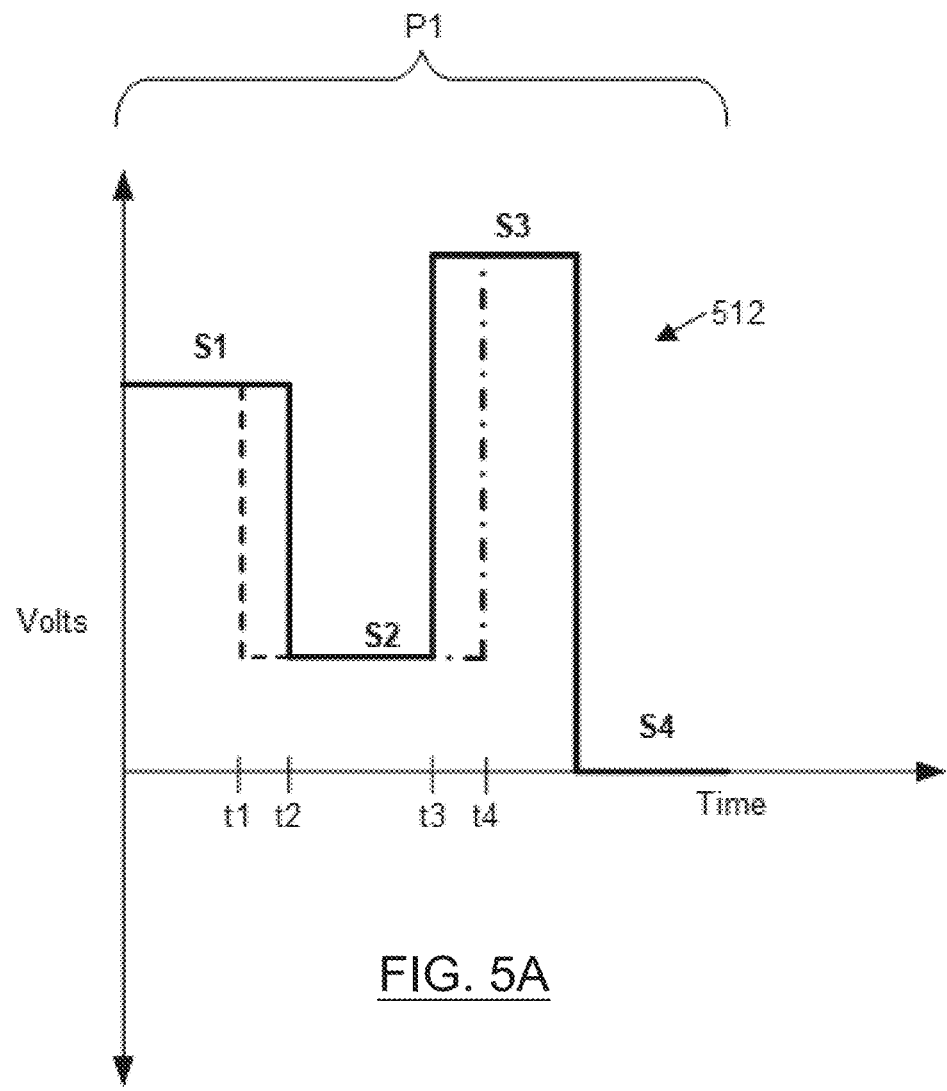
FIG. 5A shows a waveform of a pulse for modulating a RF signal.

For instance, FIG. 5A depicts a plot of voltage versus time of a multistate pulse P1 of a pulse signal 512. As shown, pulse P1 of pulse signal 512 has a plurality of states S1-S4 for modulating a RF signal (not shown) as explained herein. Although pulse signal 512 is shown as only including one pulse P1, it should be apparent that pulse signal 512 may include multiple pulses such as repeating or nonrepeating pulses. In various embodiments, pulse state latch module 474 of FIG. 4 may adjust a transition of pulse P1 of FIG. 5A from a requested state change to a later time as explained herein. For example, pulse state latch module 474 may delay a transition between state S1 and state S2 from time t1 to time t2, thereby increasing the width of state S1. With knowledge of this transition adjustment, a subsequent transition may be affected. For example, a transition between state S2 and state S3 may be advanced in time (e.g., at time t3 instead of at time t4), may occur without a delay (e.g., at a requested state transition), etc. to help prevent unnecessary added width in state S2.

In various embodiments, synced pulse state signal 486 may represent a latched pulse state signal 484. For example, pulse state latch module 474 may be a gated D latch or another suitable latch configuration. In such examples, pulse state signal 484 is received at an input pin, port, etc. of pulse state latch module 474. Once received, pulse state signal 484 is latched, gated, etc. until sync active signal 482 is received at an enable pin, port, etc. of pulse state latch module 474. In response to receiving sync active signal 482 at the enable pin, port, etc., pulse state latch module 474 may copy pulse state signal 484 at its output, allow pulse state signal 484 to pass through, etc.

As shown in FIG. 4, RF power control module 476 receives synced pulse state signal 486 to initiate a transition of the pulse. Once synced pulse state signal 486 is received, RF power control module 476 generates control or drive signal 488 for controlling when the pulse changes state (e.g., at the adjusted transitions) to ensure alignment between pulse edges and the defined phases of the bias signal. In some examples, control signal 488 may be provided to drive RF power source or amplifier (e.g., RF power source or amplifier 114a of FIG. 1) in the source RF generator 412a.

Figure 5B:
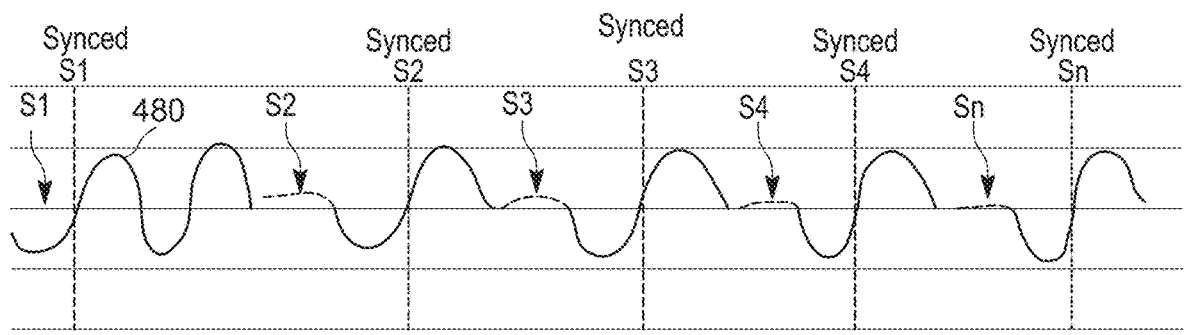
FIG. 5B shows a waveform of the bias sync signal of FIG. 4.

FIG. 5B depicts sinusoidal bias signal 480 of FIG. 4 over time and the generated signals used with RF power delivery system 400. For example, signals S1, S2, S3, S4, . . . , Sn of FIG. 5B correspond to instances of when pulse state signal 484 of FIG. 4 are generated, and signals Synced S1, Synced S2, Synced S3, Synced S4 . . . , Synced Sn correspond to instances of when synced pulse state signals 486 of FIG. 4 are generated. Although not shown, sync active signal 482 of FIG. 4 may be represented in FIG. 5B as signals at zero crossings of sinusoidal bias signal 480 or another desired phase of the bias signal 480.

As explained herein, a state transition of a pulse (e.g., the start of the pulse, a transition between states within a pulse, etc.) may be adjusted as desired to synchronize with any suitable phase of the bias signal. For example, FIGS. 6A-D depict various plots of voltage versus time to show adjusted state transitions synchronized with different defined phases of the bias signal.

Figure 6A:
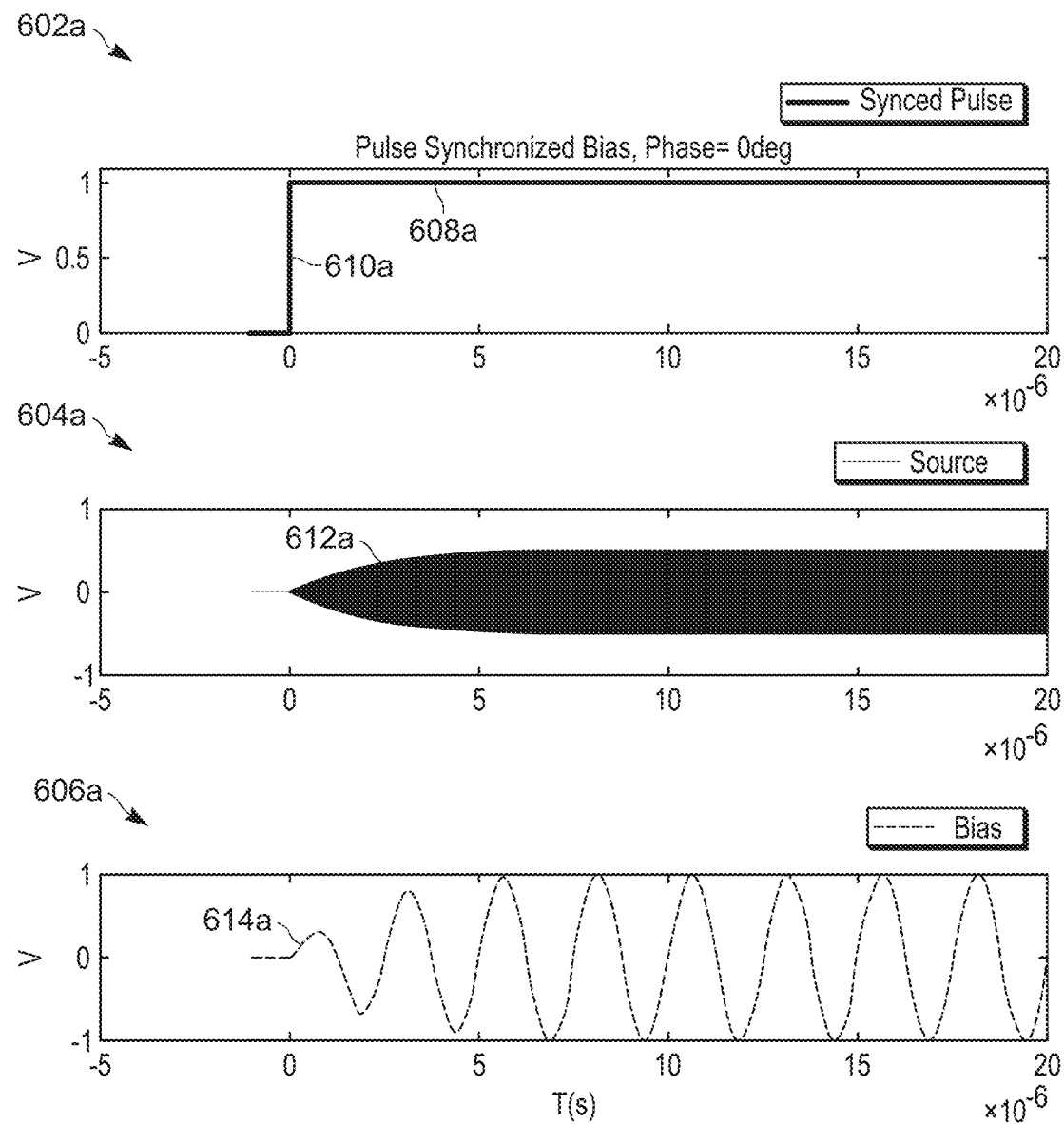

Specifically, FIG. 6A depicts plot 602a including synced pulse 608a, plot 604a including source signal 612a, and plot 606a including bias signal 614a. When the pulse 608a changes state at pulse edge 610a, source signal 612a and bias signal 614a begin to increase. As shown, pulse 608a changes state at pulse edge 610a corresponding to a 0 degree phase of bias signal 614a.

Figure 6B:
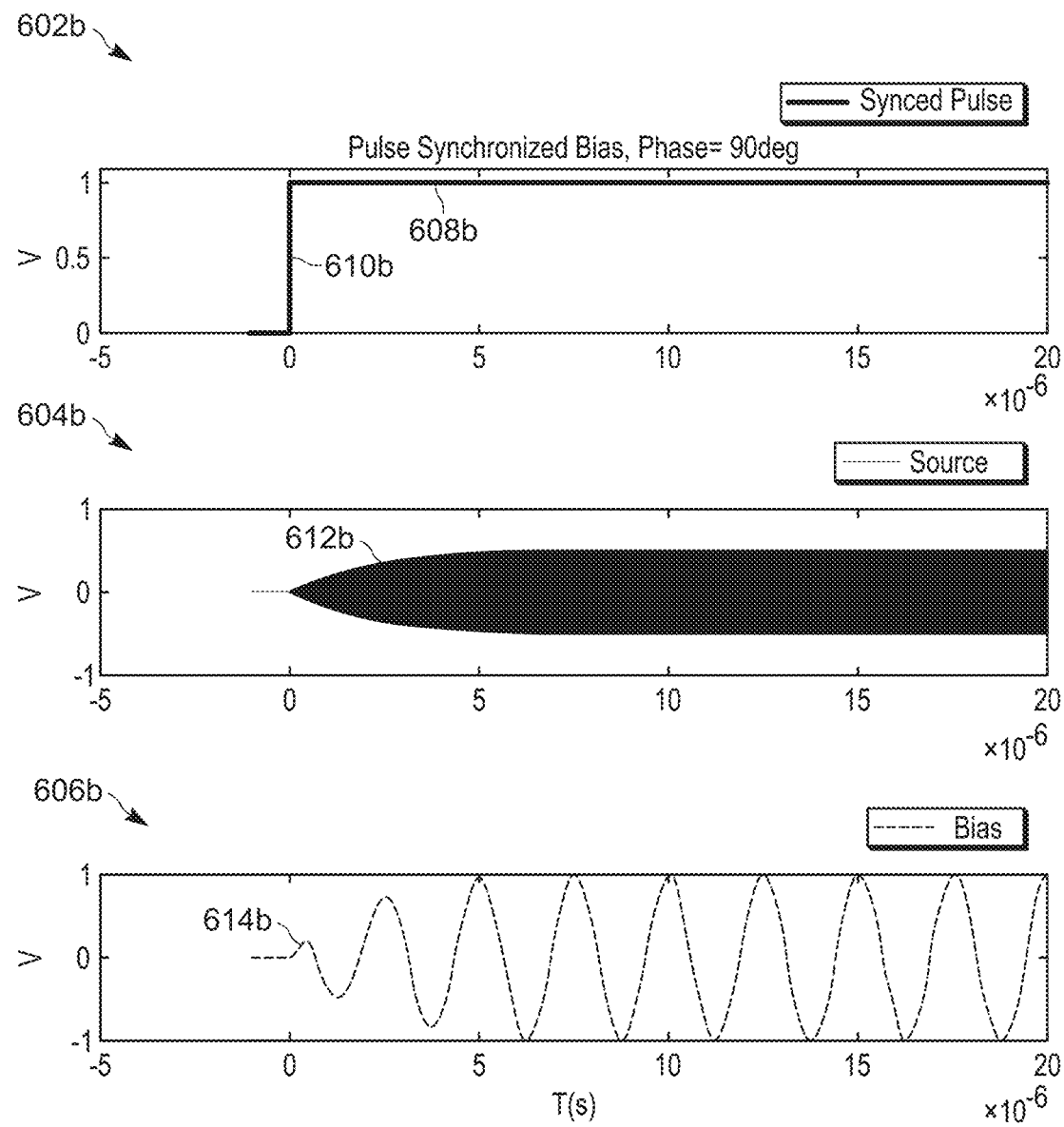
Figure 6C:
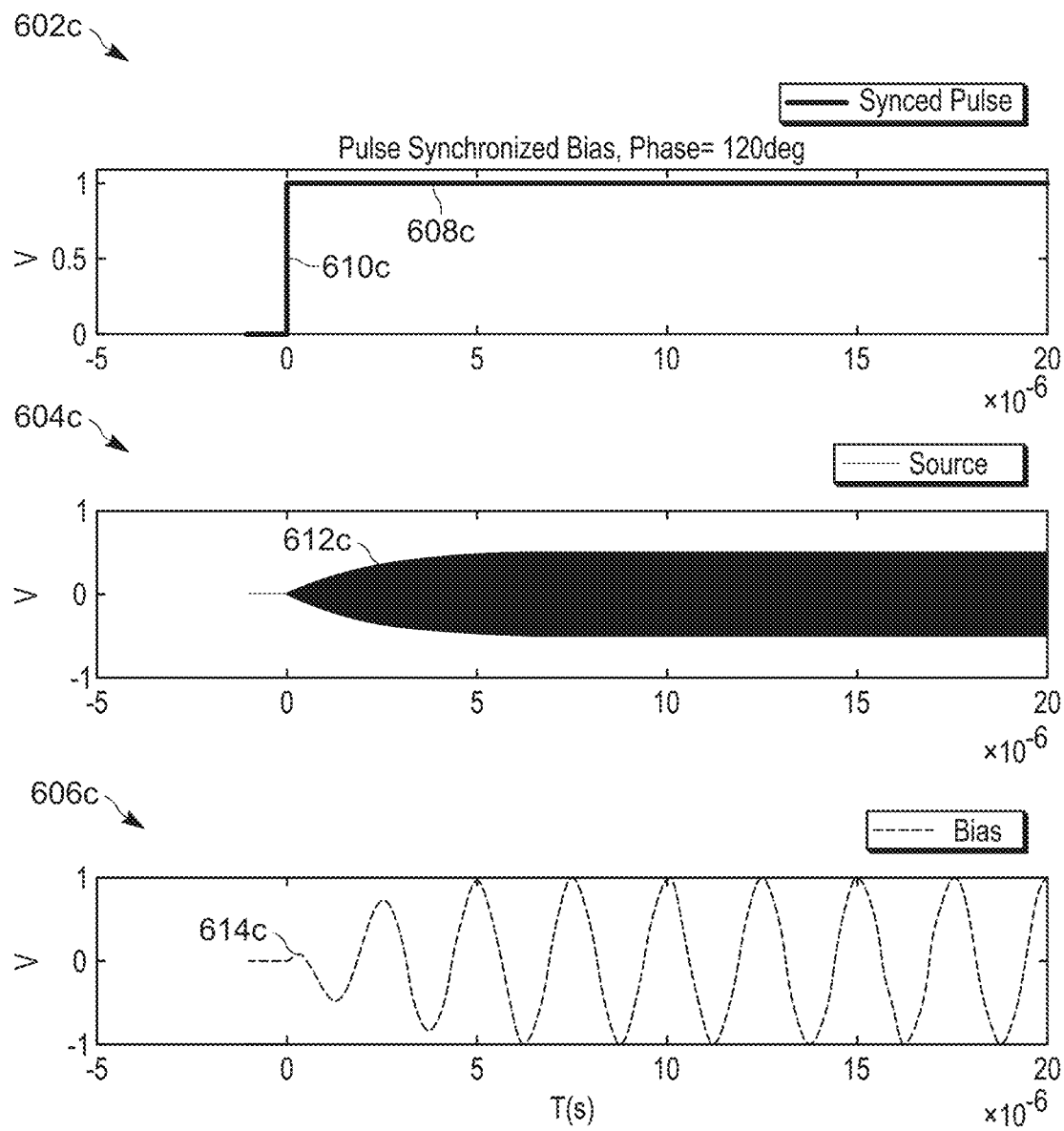
Figure 6D:
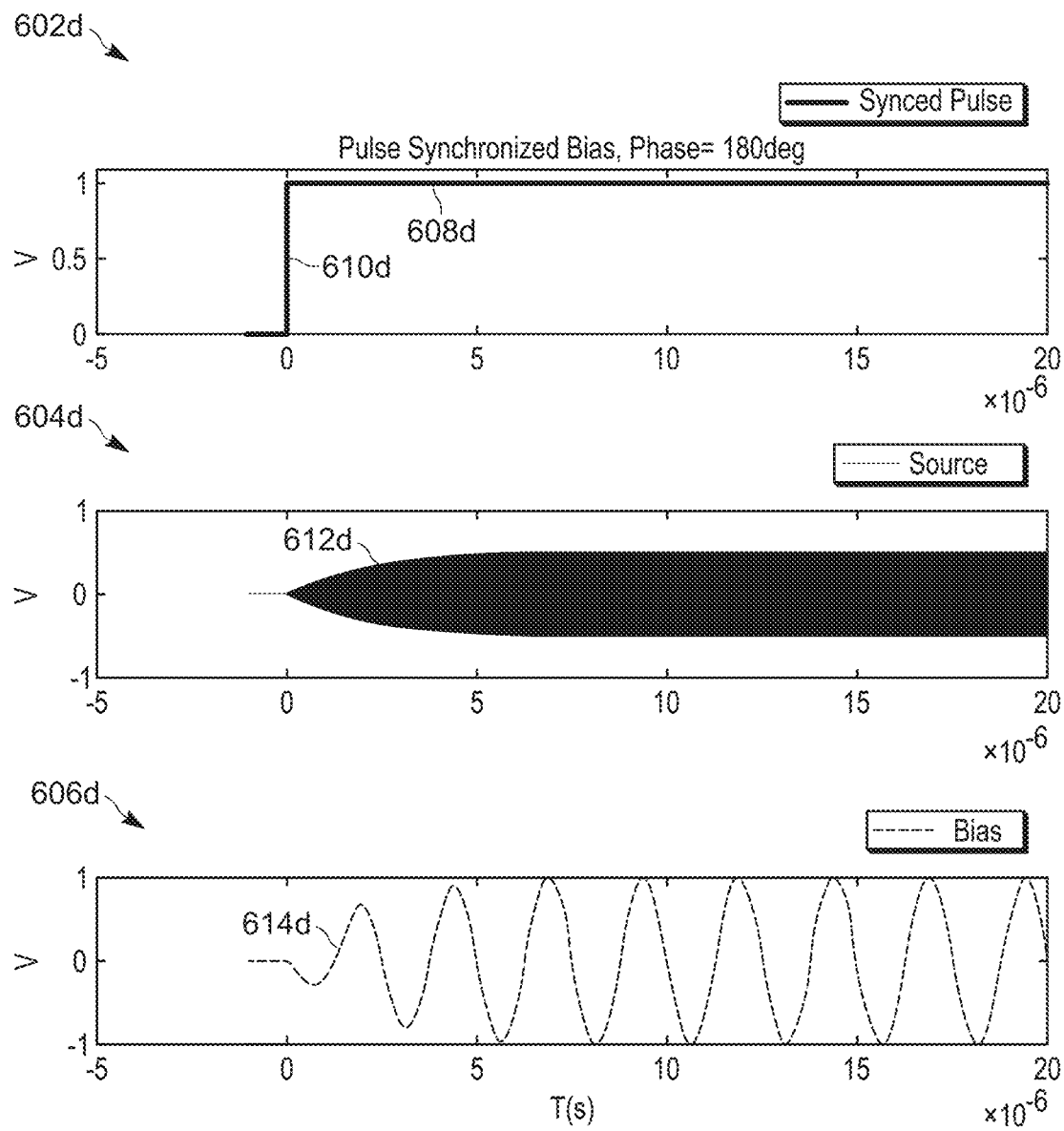

FIG. 6B-D depict similar plots as FIG. 6A, but where a pulse changes state at a pulse edge corresponding to different phases of the bias signal. For example, FIGS. 6B-D depict plots 602b, 602c, 602d including synced pulses 608b, 608c, 608d, plots 604b, 604c, 604d including source signals 612b, 612c, 612d, and plots 606b, 606c, 606d including bias signals 614b, 614c, 614d, respectively. As shown in FIG. 6B, pulse 608b changes state at pulse edge 610b corresponding to a 90 degree phase of bias signal 614b. In FIG. 6C, pulse 608c changes state at pulse edge 610c corresponding to a 120 degree phase of bias signal 614c. In FIG. 6D, pulse 608d changes state at pulse edge 610d corresponding to a 180 degree phase of bias signal 614d.

In the example of FIGS. 6A-D, the frequency of each bias signal 614a-d is lower than the frequency of its corresponding source signal 612a-d. Additionally, synced pulse signals 608a-d and bias signals 614a-d of FIGS. 6A-D may correspond to signals in FIG. 4. For example, synced pulse signals 608a-d may correspond to synced pulse state signal 486 generated by pulse state latch module 474 of FIG. 4. Additionally, bias signals 614a-d may correspond to bias signal 480 of FIG. 4.

In various embodiments, the teachings herein may be implemented with IMD mitigation techniques. For example, the frequency of a bias RF power signal (e.g., RF power signal $f_2$ of FIG. 1) is commonly lower than the frequency of a source RF power signal (e.g., RF power signal $f_1$ of FIG. 1). Particularly at higher bias powers, the lower frequency RF bias signal introduces IMD, and the IMD causes impedance fluctuations in a load, such as load 132 of FIG. 1. U.S. Pat. No. 9,947,514, issued Apr. 17, 2018 and entitled Plasma RF Bias Cancellation System, assigned to the assignee of the present application and incorporated by reference herein, describes various methods of IMD mitigation. In the referenced U.S. patent, IMD mitigation may be achieved by, for example, adjusting the frequency of the source RF power signal. For example, frequency offsets can be added to the source RF power signal to compensate for anticipated impedance fluctuations introduced by the bias RF power signal. The frequency offsets can be predetermined and stored in a lookup table, or the frequency offsets can be determined dynamically.

FIG. 7 depicts one example implementation of RF power delivery system 700 for synchronizing a pulse edge with a defined phase of a bias signal and mitigating IMD. For example, RF power delivery system 700 of FIG. 7 is implemented with the same pulse adjustment modules for synchronizing a pulse edge with a defined phase of a bias signal as explained above in FIG. 4. Specifically, RF power delivery system 700 includes source RF generator 712a and bias RF generator 412b of FIG. 4, both of which may be as described above with respect to generators 112a, 112b of FIG. 1. Source RF generator 712a includes a controller with modules 470, 472, 474, 476 of FIG. 4 and IMD control module 790.

In the example of FIG. 7, IMD control module 790 includes playback module 792, frequency offset module 794, and update module 796. Playback module 792, frequency offset module 794, and update module 796 may function is a similar manner as playback modules, frequency offset modules, and update modules described U.S. Pat. No. 9,947,514 referenced above.

As shown in FIG. 7, IMD control module 790 receives sync active signal 482, which is generated by sync monitor module 470 as explained above. In various embodiments, sync active signal 482 is provided to playback module 792 and may function as triggering event or signal to initiate the addition of frequency offsets to the source RF power signal as described in U.S. Pat. No. 9,947,514 referenced above. For instance, when sync active signal 482 changes state (e.g., from zero to one), playback module 792 may initiate a frequency hopping pattern to adjust the frequency of the source RF power signal.

In various embodiments, the frequency hopping pattern may be initiated each cycle. The frequency hopping pattern may be the same for each cycle, or vary cycle to cycle. In some examples, the frequency hopping pattern may be played at a certain rate every time bias signal 480 crosses zero (e.g., a positive going zero crossing). In such examples, the frequency hopping pattern may finish just before the next sync active signal 482 fires (e.g., just before the next positive going zero crossing). As such, a repeating frequency pattern may be achieved that is locked to sync active signal 482, which is also used to adjust a pulse edge of a pulse as explained herein.

As shown in FIG. 7, IMD control module 790 generates IMD control signal 798 based on sync active signal 482. For example, IMD control module 790 outputs IMD control signal 798 to RF power control module 476 to control the frequency of the source RF power signal based on the frequency offsets in the hopping pattern. As such, IMD mitigation is achieved while synchronizing a pulse edge with a defined phase of the bias signal 480.

In other embodiments, IMD mitigation techniques may be implemented in a matching network of a RF power delivery system. For example, in some RF systems, it is desirable to increase bias power provided to a load. This increased bias power is sometimes accompanied by a lower bias frequency requirement along with an increase in the number of bias power sources coupled to the load. The increased power at a lower bias frequency and the increased number of bias power sources results in IMD. U.S. patent application Ser. No. 17/073,709, filed Oct. 19, 2020 and entitled Intermodulation Distortion Mitigation Using Electronic Variable Capacitor, assigned to the assignee of the present application and incorporated by reference herein, describes such IMD emissions and various methods of IMD mitigation. In the referenced U.S. patent application, IMD mitigation may be achieved by, for example, controlling capacitance or reactance across a variable capacitor or reactance in a matching network.

FIG. 8 depicts one example implementation of RF power delivery system 800 for synchronizing a pulse edge with a defined phase of a bias signal and mitigating IMD. For example, RF power delivery system 800 of FIG. 8 is implemented with the same pulse adjustment modules for synchronizing a pulse edge with a defined phase of a bias signal as explained above in FIG. 4. Specifically, RF power delivery system 800 includes source RF generator 812a, bias RF generator 412*b* of FIG. 4, and matching network 818. As shown, source RF generator 812*a* includes a controller with modules 470, 472, 474, 476 of FIG. 4. Source RF generator 812*a*, bias RF generator 412*b*, and matching network 818 may be as described above with respect to generators 112*a*, 112*b* and matching network 118*a*, 118*b* of FIG. 1. In various embodiments, matching network 818 may be implemented as a dual matching network as described in U.S. patent application Ser. No. 17/073,709 referenced above.

As shown in FIG. 8, matching network 818 includes IMD control module 890 having playback module 892, reactance or capacitance offset module 894, and update module 896. Playback module 892, reactance or capacitance offset module 894, and update module 896 may function is a similar manner as playback modules, reactance or capacitance offset modules, and update modules described in U.S. patent application Ser. No. 17/073,709 referenced above.

In the example of FIG. 8, IMD control module 890 receives sync active signal 482, which is generated by sync monitor module 470 as explained above. In various embodiments, sync active signal 482 is provided to playback module 892 and may function as triggering event or signal to synchronize the application of reactance, whether one or both of inductive or capacitive offset (or adjustment) to matching network 818, as described U.S. patent application Ser. No. 17/073,709 referenced above. For instance, when sync active signal 482 changes state (e.g., from zero to one), playback module 892 may initiate the adjustment of reactance or capacitance across a variable reactance or capacitor (not shown) in matching network 818. In such examples, each adjustment of reactance or capacitance in matching network 818 may be locked to sync active signal 482, which is also used to adjust a pulse edge of a pulse as explained herein. By adjusting reactance or capacitance in matching network 818, IMD may be mitigated. As such, IMD mitigation is achieved while synchronizing a pulse edge with a defined phase of the bias signal 480, as explained herein.

FIGS. 9 and 10 depict plots 900, 1000 of voltage versus time to show adjusted state transitions synchronized with different defined phases of a bias signal, while also achieving IMD mitigation. For example, plots 900, 1000 include synced pulse state signals 902, 1002, signals 904, 1004 representing reflected power of a 60 MHz source generator (e.g., source RF generator 712*a*, 812*a* of FIGS. 7 and 8), signals 906*a*, 1006*a* representing forward power of a 400 kHz bias generator (e.g., bias RF generator 412*b* of FIGS. 7 and 8), and sync signals 906*b*, 1006*b*. In various embodiments, synced pulse state signal 902, 1002 of FIGS. 9 and 10 may correspond to synced pulse state signal of FIGS. 7 and 8, and sync signal 906*b*, 1006*b* of FIGS. 9 and 10 may correspond to bias sync signal of FIGS. 7 and 8.

As shown in FIGS. 9 and 10, a state transition of a pulse is adjusted to synchronize with different defined phases of sync signal 906*b*, 1006*b*. For example, in FIG. 9, synced pulse state signal 902 changes state at a pulse edge corresponding to about a 180 degree phase of sync signal 906*b*. In FIG. 10, synced pulse state signal 1002 changes state at a pulse edge corresponding to about a 90 degree phase of sync signal 1006*b*.

In various embodiments, one or more signals generated in one RF generator, such as RF generator 412*a* of FIG. 4, may be provided to one or more other RF generators, one or more components, etc. in a RF power delivery system. For instance, one RF generator such as a source RF generator may provide a feedback signal to one or more other RF generators, such as a bias RF generator, for controlling the other generators. In such examples, the RF generator providing the feedback signal is considered a leader, and the RF generator(s) receiving the feedback signal are considered followers. In other examples, one RF generator such as a source RF generator may provide a feedback signal to one or more components such as a matching network as further explained below.

For example, FIG. 11 depicts one example implementation of RF power delivery system 1100 for synchronizing a pulse edge with a defined phase of the bias signal. RF power delivery system 1100 of FIG. 11 is implemented with the same pulse adjustment modules for synchronizing a pulse edge with a defined phase of a bias signal as explained above in FIG. 4. Specifically, RF power delivery system 1100 includes source RF generator 1112*a*, bias RF generator 412*b* of FIG. 4, and one or more other RF generators 1112*n*. As shown, source RF generator 1112*a* includes a controller with modules 470, 472, 474, 476 of FIG. 4. RF generators 412*b*, 1112*a*, 1112*n* may be as described above with respect to generators 112*a*, 112*b* of FIG. 1.

In the example of FIG. 11, synced pulse state signal 486 is fed back to RF generators 412*b*, 1112*n*. More specifically, pulse state latch module 474 of source RF generator 1112*a* generates and outputs synced pulse state signal 486 to RF generators 412*b*, 1112*n*. RF generator 412*b* and/or RF generator(s) 1112*n* may utilize synced pulse state signal 486 in various manners. For example, synced pulse state signal 486 may instruct RF generator 412*b* and/or RF generator(s) 1112*n* when to operate, change pulse states, to start moving provided power to a next state, to start moving frequency to a next state, etc.

In some examples, synced pulse state signal 486 may be provided to RF generator 412*b* and/or RF generator(s) 1112*n* to activate a pulse shaping mode in RF generator 412*b* and/or RF generator(s) 1112*n*. For example, U.S. Pat. No. 10,049,857, issued Aug. 14, 2018 and entitled Adaptive Periodic Waveform Controller, assigned to the assignee of the present application and incorporated by reference herein, describes various modules for shaping a pulse based on one or more setpoints. These setpoints may include, for example, forward power setpoints generated based on a repeating pattern. In the referenced U.S. patent, a trigger signal may be generated to initiate a pulse shaping method based on the one or more setpoints.

In various embodiments, RF generator 412*b* and/or RF generator(s) 1112*n* may include a controller with one or more modules for shaping a pulse based on one or more setpoints as described in U.S. Pat. No. 10,049,857 referenced above. In such examples, synced pulse state signal 486 may function as a trigger signal to initiate a pulse shaping method based on the one or more setpoints as described in U.S. Pat. No. 10,049,857.

As shown in FIG. 11, RF power delivery system 1100 further includes one or more components 1118*n*. Components 1118*n* may include any suitable component that receives a control signal. For example, components 1118*n* may include one or more matching networks as described above with respect to matching network 118*a*, 118*b* of FIG. 1.

In the example of FIG. 11, synced pulse state signal 486 is fed back to components 1118*n*. More specifically, pulse state latch module 474 of source RF generator 1112*a* generates and outputs synced pulse state signal 486 to components 1118*n*. In examples where at least one of the components 1118*n* is a matching network such as an electronic matching network, synced pulse state signal 486 may instruct the matching network to begin its tuning process. In such examples, the tuning of the matching network may be aligned with synced pulse state signal 486.

For example, FIG. 12 depicts one example implementation of RF power delivery system 1200 for synchronizing a pulse edge with a defined phase of the bias signal. RF power delivery system 1200 of FIG. 12 is implemented with the same pulse adjustment modules for synchronizing a pulse edge with a defined phase of a bias signal as explained above in FIG. 4. Specifically, RF power delivery system 1200 includes source RF generator 1212*a*, bias RF generator 412*b* of FIG. 4, and matching network 1218. As shown, source RF generator 1212*a* includes a controller with modules 470, 472, 474, 476 of FIG. 4. Additionally, RF generators 412*b*, 1112*a*, and matching network 1218 may be as described above with respect to generators 112*a*, 112*b* and matching network 118*a*, 118*b* of FIG. 1.

In the example of FIG. 12, synced pulse state signal 486 is provided to matching network 1218. More specifically, pulse state latch module 474 of source RF generator 1212*a* generates and outputs synced pulse state signal 486 to matching network 1218. In such examples, matching network 1218 may utilize synced pulse state signal 486 as a signal to begin tuning. In other words, synced pulse state signal 486 may instruct matching network 1218 when to begin tuning to ensure the tuning of matching network 1218 is aligned with synced pulse state signal 486.

The systems disclosed herein may be operated using numerous methods including the various control system methods of which are illustrated in FIGS. 1, 4, 7, 8, 11, and 12. FIG. 13 depicts one example flow chart for operations primarily described with respect to the implementation of FIG. 4. Although the following operations are primarily described with respect to the implementation of FIG. 4, the operations may be easily modified to apply to other implementations of the present disclosure. The operations may be iteratively performed. Although the following operations are shown and primarily described as being performed sequentially, one or more of the following operations may be performed while one or more of the other operations are being performed.

FIG. 13 shows a flow chart 1300 of a control system for performing pulse edge adjustment control for, for example, power delivery system 400 of FIG. 4. Control begins and proceeds to blocks 1302, 1306, which are independent of each other. At block 1302, control generates a pulse state signal (e.g., pulse state signal 484 of FIG. 4) indicating a request to change pulse states (e.g., start a pulse, transition between states within a pulse, etc.). In some examples, the pulse state signal is generated by a pulse state generator module such as pulse state generator module 472 of FIG. 4. At block 1306, control determines whether a bias sync signal (e.g., bias sync signal 430 of FIG. 4) has been received. Blocks 1302, 1306 may be executed at the same or different times. For example, control may determine whether the bias sync signal is received in block 1306 before or after or at the same time as control generates the pulse state signal in block 1302.

If the bias sync signal is received in block 1306, control proceeds to block 1310. Otherwise, control returns to block 1306 to again determine whether a bias sync signal has been received. At block 1310, control generates a sync active signal (e.g., sync active signal 482 of FIG. 4) based on the received bias sync signal. For example, control may generate the sync active signal based on a defined phase of the bias sync signal. In such examples, after receiving the bias sync signal, control may impose a desired time delay to the bias sync signal based on the defined phase (e.g., 0 degrees, 90 degrees, 120 degrees, 180 degrees, etc.). After the time delay, control generates the sync active signal.

After control generates the sync active signal in block 1310, control proceeds to block 1314. At block 1314, control transmits the sync active signal to a pulse state latch module such as pulse state latch module 474 of FIG. 4. Next, control returns to block 1306 to again determine whether a bias sync signal has been received.

After control generates the pulse state signal in block 1302, control proceeds to block 1318. At block 1318, control transmits the pulse state signal to the pulse state latch module. As such, both the pulse state signal and the sync active signal are provided to the pulse state latch module, but not necessarily at the same time.

At block 1322, control determines whether the pulse state latch module has received the pulse state signal. If yes, control proceeds to block 1326. Otherwise, control returns to block 1322. In other examples, control may return to block 1302 or block 1318 if it is determined that the pulse state latch module has not received the pulse state signal.

At block 1326, control determines whether the pulse state latch module has received the sync active signal. If yes, control proceeds to block 1330. Otherwise, control returns to block 1326. At block 1330, control generates, with the pulse state latch module, a synced pulse state signal to initiate a transition of the pulse. In this way, the pulse state latch module delays initiating a transition of the pulse until both the sync active signal and the pulse state signal are received. For example, the pulse state latch module may initially receive the pulse state signal indicating a request to change states. However, the pulse state latch module delays generating, outputting, etc. the synced pulse state signal until it also receives the sync active signal. As such, the pulse state latch module adjusts the transition of the pulse from the requested state change (based on the pulse state signal) to a later time based on the sync active signal. This adjustment ensures a state change of the pulse is aligned with the defined phase of the bias sync signal.

After control generates the synced pulse state signal to initiate a transition of the pulse in block 1330, control returns to again generate a pulse state signal indicating a request to change pulse states.

FIG. 14 incorporates various exemplary components of the prior figures in a control module. Specifically, FIG. 14 depicts control module 1400 as including power generation module section and pulse edge adjustment module section. Power generation module section includes RF amplitude control module 1404 and RF frequency control module 1408. RF amplitude control module 1404 includes playback module 1416, amplitude adjustment module 1420, and amplitude update module 1424. RF frequency control module 1408 includes playback module 1428, frequency adjustment module 1432, and frequency update module 1436. Pulse edge adjustment module section includes pulse edge control module 1412 having pulse state generator module 1440, sync monitor module 1444, pulse state latch module 1448, and RF power control module 1452. In various examples, RF power control module 1452 may be incorporated at least partially in the power generation module section. In various embodiments, control module 1400 includes one or a plurality of processors that execute code associated with the module sections or modules 1400, 1404, 1408, 1412, 1416, 1420, 1424, 1428, 1432, 1436, 1440, 1444, 1448, 1452.

Operation of at least the module sections or modules 1400, 1412, 1440, 1444, 1448, and 1452 is described above with respect to the example method of FIG. 14. For further defined structure of the controllers and modules described herein, see the above provided description and the flow chart of FIG. 14 and the below provided definition for the term "module".

Although specific implementations of controllers are described herein for performing, for example, pulse edge adjustment control, it should be apparent that any suitable control implementation may be employed. For example, in various embodiments, any one of controllers disclosed herein may implement a multiple input, multiple output (MIMO) control system, a single-input and single-output (SISO) control system, etc. Additionally, in various embodiments, any one of controllers disclosed here may implement artificial intelligence (AI) control techniques, machine learning (ML) techniques, etc.

Employing any one of the pulse edge adjustment implementations and associated control techniques explained herein may result in various advantages. For example, the pulse edge adjustment implementations and associated control techniques disclosed herein ensure synchronization between a pulse edge of a pulse and a defined phase of a bias signal by adjusting a state transition of the pulse (e.g., the start of the pulse, a transition between states within a pulse, etc.). Such synchronization eliminates the randomness of a bias RF power signal with respect to a pulse edge in the pulse and ensures power delivered to a load and plasma properties such as ion energy associated with the load are more repeatable. Further, synchronization may occur between RF signals from the source and bias RF generators.

Additionally, in many instances, a pulse rate and duty cycle which defines a desired pulse transition time may be specified by a user. The pulse edge adjustment implementations and associated control techniques disclosed herein ensure that the actual pulse transition occurs near this desired pulse transition time, but is synchronized with a defined phase of the bias.

Further, the pulse edge adjustment implementations and associated control techniques disclosed herein may provide for reduced reflected power, increased generator reliability, reduced IMD on the pulse edges, and increased pulse energy repeatability.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set— in other words, in some circumstances a "set" may have zero elements. The term "non-empty set" may be used to indicate exclusion of the empty set— in other words, a non-empty set will always have one or more elements. The term "subset" does not necessarily require a proper subset. In other words, a "subset" of a first set may be coextensive with (equal to) the first set. Further, the term "subset" does not necessarily exclude the empty set— in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A Further, for information sent from element A to element B, element B may send requests for, or receipt acknowledgements of, the information to element A In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WP AN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WP AN are IEEE Standard 802.15.4 (including the ZIGBEE standard from the ZigBee Alliance) and, from the Bluetooth Special Interest Group (SIG), the BLUE TOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

The invention claimed is:

1. A radio frequency (RF) generator comprising:
    a RF power source configured to output an RF power signal; and
    a controller coupled to the RF power source, the controller configured to:
        generate a pulse to modulate the RF power signal of the RF power source, the pulse including one or more state transitions;
        receive a sync signal indicative of one or more operating characteristics or parameters of an other RF generator; and adjust at least one of the state transitions of the pulse to synchronize the state transition with a defined phase of the received sync signal,
wherein the controller includes a sync monitor module configured to receive the sync signal and generate a sync active signal based on the defined phase of the sync signal.

2. The RF generator of claim 1, wherein the sync signal is a square waveform generated by the other RF generator.

3. The RF generator of claim 2, wherein the sync signal changes states at zero crossings of an RF power signal from the other RF generator.

4. The RF generator of claim 1, wherein the defined phase includes 0 degrees, 90 degrees, 120 degrees, or 180 degrees.

5. The RF generator of claim 1, wherein the controller includes a pulse state latch module in communication with the sync monitor module, and wherein the pulse state latch module is configured to receive a pulse state signal indicative of a desired state transition of the pulse, and in response to receiving the sync active signal, output a synced pulse state signal based on the pulse state signal to adjust the at least one of the state transitions of the pulse.

6. The RF generator of claim 5, wherein the controller includes a pulse state generator module in communication with the pulse state latch module, and wherein the pulse state generator module is configured to generate the pulse state signal.

7. The RF generator of claim 5, wherein the controller includes an RF power control module in communication with the pulse state latch module, and wherein the RF power control module is configured to receive the synced pulse state signal, and generate a control signal for controlling the pulse.

8. The RF generator of claim 5, wherein the RF generator is a first RF generator, and wherein the pulse state latch module is configured to output the synced pulse state signal to a second RF generator to activate a pulse shaping mode in the second RF generator.

9. The RF generator of claim 5, wherein the RF power source is configured to output the RF power signal to a matching network, and wherein the pulse state latch module is configured to output the synced pulse state signal to the matching network to align tuning of the matching network with the synced pulse state signal.

10. The RF generator of claim 1, wherein the controller includes an intermodulation distortion (IMD) control module configured to receive the sync active signal, and generate an IMD control signal based on the sync active signal to control a frequency of the RF power signal.

11. The RF generator of claim 1, wherein the RF power source is configured to output the RF power signal to a matching network, and wherein the controller is configured to output the sync active signal to the matching network for controlling the matching network.

12. The RF generator of claim 1, wherein the at least one of the state transitions is a first state transition, and wherein the controller is configured to adjust a second state transition of the pulse based on the adjustment of the first state transition.

13. A non-transitory computer-readable medium storing processor-executable instructions for controlling a radio frequency (RF) generator of a power supply system that outputs a RF power signal, the RF generator including a RF power source, the instructions comprising:
generating a pulse to modulate the RF power signal of the RF power source, the pulse including one or more state transitions;
receiving a sync signal indicative of one or more operating characteristics or parameters of an other RF generator; and
adjusting at least one of the state transitions of the pulse to synchronize the state transition with a defined phase of the received sync signal; and
receiving the sync signal and generate a sync active signal based on the defined phase of the sync signal.

14. The non-transitory computer-readable medium storing processor-executable instructions of claim 13, wherein the sync signal is a square waveform generated by the other RF generator.

15. The non-transitory computer-readable medium storing processor-executable instructions of claim 14, wherein the sync signal changes states at zero crossings of an RF power signal from the other RF generator.

16. The non-transitory computer-readable medium storing processor-executable instructions of claim 13, further comprising receiving a pulse state signal indicative of a desired state transition of the pulse, and in response to receiving the sync active signal, outputting a synced pulse state signal based on the pulse state signal to adjust the at least one of the state transitions of the pulse.

17. The non-transitory computer-readable medium storing processor-executable instructions of claim 16, further comprising receiving the synced pulse state signal and generating a control signal for controlling the pulse in accordance with the sync signal.

18. The non-transitory computer-readable medium storing processor-executable instructions of claim 17, further comprising outputting the synced pulse state signal to a second RF generator to activate a pulse shaping mode in the second RF generator.

19. The non-transitory computer-readable medium storing processor-executable instructions of claim 17, further comprising outputting the synced pulse state signal to a matching network to align tuning of the matching network with the synced pulse state signal.

20. The non-transitory computer-readable medium storing processor-executable instructions of claim 13, further comprising receiving the sync active signal and generating an IMD control signal based on the sync active signal to control a frequency of the RF power signal.

21. The non-transitory computer-readable medium storing processor-executable instructions of claim 13, further comprising outputting the sync active signal to a matching network for controlling a matching network.

22. The non-transitory computer-readable medium storing processor-executable instructions of claim 13, wherein the at least one of the state transitions is a first state transition, and further comprising adjusting a second state transition of the pulse based on the adjustment of the first state transition.

23. A method for controlling a radio frequency (RF) generator of a power supply system, the method comprising:
generating a pulse to modulate a RF power signal output by a RF power source, the pulse including one or more state transitions;
receiving a sync signal indicative of one or more operating characteristics or parameters of an other RF generator;
adjusting at least one of the state transitions of the pulse to synchronize the state transition with a defined phase of the received sync signal; and
receiving the sync signal and generate a sync active signal based on the defined phase of the sync signal.

24. The method of claim 23, wherein the sync signal is a square waveform generated by the other RF generator.

25. The method of claim 24, wherein the sync signal changes states at zero crossings of an RF power signal from the other RF generator.

26. The method of claim 23, further comprising receiving a pulse state signal indicative of a desired state transition of the pulse, and in response to receiving the sync active signal, outputting a synced pulse state signal based on the pulse state signal to adjust the at least one of the state transitions of the pulse.

27. The method of claim 26, further comprising receiving the synced pulse state signal and generating a control signal for controlling the pulse in accordance with the synched pulse state-sync signal.

28. The method of claim 27, further comprising outputting the synced pulse state signal to a second RF generator to activate a pulse shaping mode in the second RF generator.

29. The method of claim 27, further comprising outputting the synced pulse state signal to a matching network to align tuning of the matching network with the synced pulse state signal.

30. The method of claim 23, further comprising receiving the sync active signal and generating an IMD control signal based on the sync active signal to control a frequency of the RF power signal.

31. The method of claim 23, further comprising outputting the sync active signal to a matching network for controlling a matching network.

\* \* \* \* \*